United States Patent
Aoyama

(10) Patent No.: US 12,407,317 B2
(45) Date of Patent: Sep. 2, 2025

(54) FILTER CIRCUIT

(71) Applicant: Panasonic Intellectual Property Management Co., Ltd., Osaka (JP)

(72) Inventor: Kazuaki Aoyama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 202 days.

(21) Appl. No.: 18/263,708

(22) PCT Filed: Feb. 22, 2022

(86) PCT No.: PCT/JP2022/007213
§ 371 (c)(1),
(2) Date: Aug. 1, 2023

(87) PCT Pub. No.: WO2022/181606
PCT Pub. Date: Sep. 1, 2022

(65) Prior Publication Data
US 2024/0097637 A1    Mar. 21, 2024

(30) Foreign Application Priority Data

Feb. 24, 2021   (JP) .................. 2021-027947

(51) Int. Cl.
*H03H 7/09*    (2006.01)
*H01G 9/012*   (2006.01)
(Continued)

(52) U.S. Cl.
CPC ........... *H03H 7/0115* (2013.01); *H01G 9/012* (2013.01); *H01G 9/26* (2013.01)

(58) Field of Classification Search
CPC .......... H03H 7/00; H03H 7/09; H03H 7/0115; H01G 9/00; H01G 9/012; H01G 9/26
(Continued)

(56) References Cited

U.S. PATENT DOCUMENTS

| 6,355,561 B1 | 3/2002 | Sandhu et al. |
| 12,244,283 B2 * | 3/2025 | Ogawa ................. H03H 7/1775 |

(Continued)

FOREIGN PATENT DOCUMENTS

| CN | 211701840 | 10/2020 |
| JP | 2006-352059 | 12/2006 |

(Continued)

OTHER PUBLICATIONS

International Search Report of PCT application No. PCT/JP2022/007213 dated May 24, 2022.

*Primary Examiner* — Hai L Nguyen
(74) *Attorney, Agent, or Firm* — Rimon P.C.

(57) ABSTRACT

A filter circuit includes a resonant circuit, and the resonant circuit includes an inductance element and a capacitor. The capacitor includes an element stacked body, an exterior body, a first external electrode and a second external electrode, and a third external electrode. The element stacked body is formed as a stack of a plurality of capacitor elements. In a first capacitor element, a first end portion is electrically connected to the first external electrode. In a second capacitor element, a first end portion is electrically connected to the second external electrode. A third external electrode is electrically connected to a cathode part of the capacitor elements.

7 Claims, 12 Drawing Sheets

(51) Int. Cl.
*H01G 9/26* (2006.01)
*H03H 7/01* (2006.01)

(58) Field of Classification Search
USPC .................................................. 333/175–185
See application file for complete search history.

(56) References Cited

U.S. PATENT DOCUMENTS

| | | |
|---|---|---|
| 12,278,609 B2 * | 4/2025 | Ogawa ................. H03H 7/0161 |
| 2009/0160579 A1 | 6/2009 | Serikawa et al. |
| 2016/0042873 A1 | 2/2016 | Kurita |

FOREIGN PATENT DOCUMENTS

| | | |
|---|---|---|
| JP | 2008-010888 | 1/2008 |
| JP | 3177245 U | 7/2012 |
| WO | 2014/174833 | 10/2014 |

* cited by examiner

US 12,407,317 B2

FILTER CIRCUIT

TECHNICAL FIELD

The present disclosure relates generally to a filter circuit, and more particularly to a filter circuit including a resonant circuit.

BACKGROUND

A digital signal processor board disclosed in Unexamined Japanese Patent Publication No. 2006-352059 includes an LSI to which an element for clock operation is connected, a power input line that supplies power to the LSI, and a decoupling capacitor that is connected between the power input line and ground. As the decoupling capacitor, a surface-mounted solid electrolytic capacitor having an ESR of 25 mΩ (100 kHz) or lower and an ESL of 800 pH (500 MHZ) or lower is used.

SUMMARY OF THE INVENTION

A filter circuit according to one aspect of the present disclosure includes a resonant circuit. The resonant circuit includes an input end, an output end, an inductance element, and a capacitor. The inductance element electrically connects between the input end and the output end. The capacitor electrically connects between the inductance element and a conductor that is at a reference potential. The capacitor is an electrolytic capacitor. The capacitor includes an element stacked body, an exterior body, a first external electrode, a second external electrode, and a third external electrode. The element stacked body is a stack of a plurality of capacitor elements. The exterior body includes a sealing member covering the element stacked body. The first external electrode and the second external electrode are electrically connected to the inductance element. The third external electrode is electrically connected to the conductor that is at the reference potential. Each of the plurality of capacitor elements includes an anode body, a dielectric layer, and a cathode part. The anode body includes a porous part on a surface of the anode body. The dielectric layer is disposed on a surface of at least a part of the porous part. The cathode part covers at least a part of the dielectric layer. In a first end portion of the each of the plurality of capacitor elements, the anode body is exposed from the exterior body. In a second end portion of the each of the plurality of capacitor elements, the anode body is covered by the cathode part. The plurality of capacitor elements includes a first capacitor element and a second capacitor element. In the first capacitor element, the first end portion is electrically connected to the first external electrode. In the second capacitor element, the first end portion is electrically connected to the second external electrode. The third external electrode is electrically connected to the cathode part of the capacitor element.

The present disclosure is advantageous in that the number of capacitors can be reduced.

DESCRIPTION OF EMBODIMENT

Figure 1:
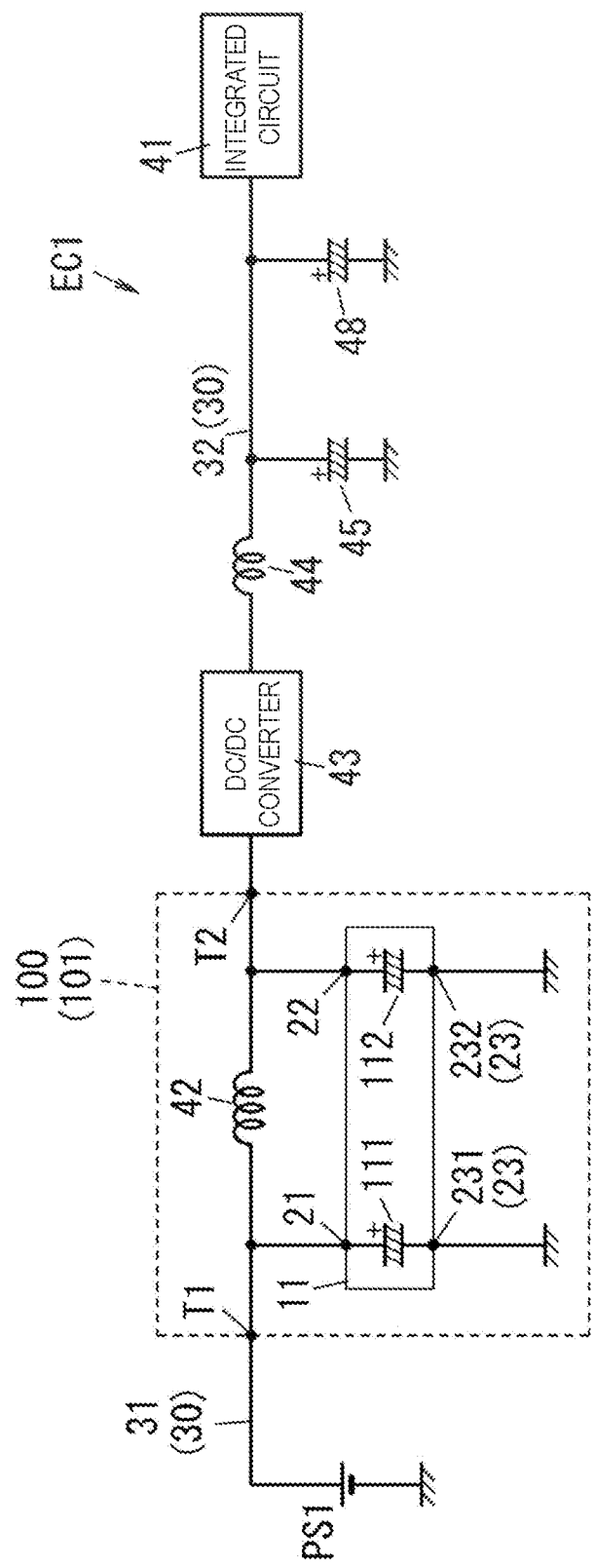
FIG. 1 is a circuit diagram of an electric circuit including a filter circuit according to an exemplary embodiment of the present disclosure.

Before explaining the exemplary embodiment, a problem in a conventional technology will be briefly explained. Conventional electric circuits are sometimes provided with a filter circuit to reduce noise. However, conventionally, such a filter circuit has often been required to include many capacitors, too, to satisfy specification requirements of the filter circuit.

In view of the problem described above, the present disclosure provides a filter circuit capable of reducing the number of capacitors.

A filter circuit according to an exemplary embodiment will now be described with reference to drawings. The following exemplary embodiment is, however, merely illustrative of various embodiments of the present disclosure. The exemplary embodiment described below can be changed variously depending on factors such as a design, as long as the object of the present disclosure can be achieved. The drawings described in the following exemplary embodiment are schematic representations, and the ratio of the sizes and the thicknesses of each component in the drawings does not necessarily need to reflect the actual dimensional ratio.

Exemplary Embodiment (Overview)

As illustrated in FIG. 1, filter circuit 100 according to the present exemplary embodiment includes resonant circuit 101. Resonant circuit 101 includes input end T1, output end T2, inductance element 42, and capacitor 11. Inductance element 42 electrically connects between input end T1 and output end T2. Capacitor 11 electrically connects between inductance element 42 and conductor W3 that is at a reference potential (see FIG. 2). Capacitor 11 is an electrolytic capacitor.

As illustrated in FIGS. 2 to 6, capacitor 11 includes an element stacked body, exterior body 14, first external electrode 21 and second external electrode 22, and third external electrode 23 (231 and 232). The element stacked body is formed as a stack of a plurality of capacitor elements 10. Exterior body 14 includes sealing member 140 covering the element stacked body. First external electrode 21 and second external electrode 22 are electrically connected to inductance element 42. Third external electrode 23 is electrically connected to conductor W3 that is at the reference potential. Each of the plurality of capacitor elements 10 includes anode body 3, a dielectric layer, and cathode part 6. Anode body 3 includes porous part 5 on a surface of anode body 3. The dielectric layer is disposed on a surface of at least a part of porous part 5. Cathode part 6 covers at least a part of the dielectric layer. In first end portion 1a of the each of the plurality of capacitor elements 10, anode body 3 is exposed from exterior body 14. In second end portion 2a of the each of the plurality of capacitor elements 10, anode body 3 is covered by cathode part 6. The plurality of capacitor elements 10 include first capacitor element 10a and second capacitor element 10b. In first capacitor element 10a, first end portion 1a is electrically connected to first external electrode 21. In second capacitor element 10b, first end portion 1a is electrically connected to second external electrode 22. Third external electrode 23 is electrically connected to cathode part 6 of capacitor elements 10.

According to the present exemplary embodiment, currents flow in different directions in first capacitor element 10a and second capacitor element 10b, respectively, and these currents generate magnetic fields in different directions, respectively. Therefore, the magnetic flux generated in the element stacked body is reduced. In this manner, equivalent series inductance (ESL) of capacitor 11 is reduced.

Further, since the ESL is reduced, the number of capacitors 11 can be reduced, compared with a configuration including a plurality of capacitors each having an ESL higher than that of capacitor 11 are connected in parallel.

First capacitor element 10a and second capacitor element 10b are stacked alternately. As a result, the magnetic flux generated in the element stacked body can be reduced effectively. Therefore, it is possible to reduce the ESL effectively.

First end portion 1a of first capacitor element 10a is exposed from first surface 14a of exterior body 14, and first end portion 1a of second capacitor element 10b is exposed from second surface 14b that is opposite to first surface 14a of exterior body 14. As a result, an effect of first capacitor element 10a and second capacitor element 10b canceling out the magnetic fluxes is enhanced, so that the ESL of capacitor 11 can be reduced effectively.

Further, at least a part of first external electrode 21 is provided on first surface 14a of exterior body 14, and at least a part of second external electrode 22 is provided on second surface 14b that is opposite to first surface 14a of exterior body 14. At least a part of third external electrode 23 is provided on third surface 14c different from first surface 14a and second surface 14b of exterior body 14.

Figure 3:
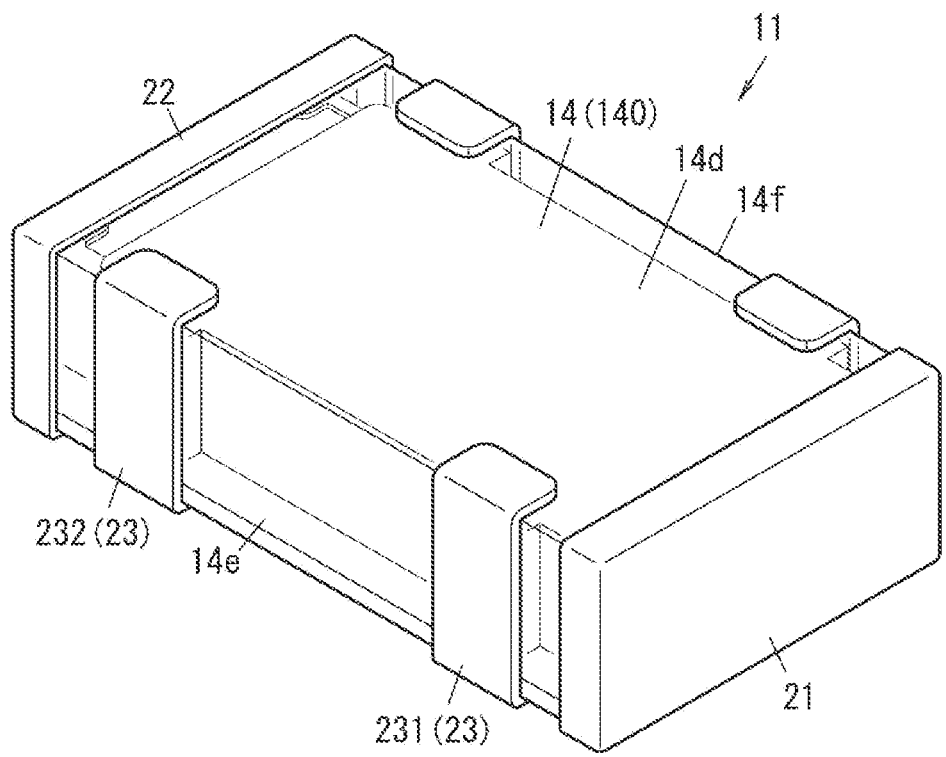
FIG. 3 is a perspective view of an electrolytic capacitor included in the filter circuit.

In the following description related to capacitor 11, the side having second surface 14b is defined as "left" with respect to first surface 14a, and the side having first surface 14a is defined as "right" with respect to second surface 14b. In addition, the side having fourth surface 14d that is opposite to third surface 14c is defined as an "upper" side with respect to third surface 14c, and the side having third surface 14c is defined as a "lower" side with respect to fourth surface 14d. Furthermore, the sides in the direction orthogonal to both upper and lower sides and left and right sides are defined as "front and rear" sides, respectively. As illustrated in FIG. 3, exterior body 14 has fifth surface 14e (front surface) and sixth surface 14f (rear surface). The height of capacitor 11 means the length of capacitor 11 in the up-down direction. However, these provisions are not intended to limit the directions in which capacitor 11 is used in any way.

Capacitor 11 is mounted on substrate B1 (see FIG. 2) in use, for example. Capacitor 11 is mounted on substrate B1 in such a manner that the bottom surfaces of first external electrode 21, second external electrode 22, and third external electrode 23 are in contact with the surface of substrate B1. In this manner, first external electrode 21, second external electrode 22, and third external electrode 23 are electrically connected to substrate B1.

In capacitor 11 according to the present exemplary embodiment, since at least apart of first external electrode 21 and at least a part of second external electrode 22 are provided on the side surfaces of exterior body 14, it is possible to reduce the portions not contributing to the electrostatic capacitance inside capacitor 11. Therefore, the capacitance of capacitor 11 can be increased. By increasing the capacitance of capacitor 11, the number of capacitors 11 can be reduced compared with a configuration in which a plurality of capacitors each having a relatively small capacitance are connected in parallel to ensure the capacitance.

(Details)
(1) Circuit Configuration

To begin with, filter circuit 100 and electric circuit EC1 including filter circuit 100 according to the present exemplary embodiment will be described with reference to FIG. 1.

Electric circuit EC1 supplies power to integrated circuit 41. Electric circuit EC1 includes filter circuit 100, DC/DC converter 43, and conductors serving as a plurality of circuits 30. The plurality of circuits 30 include first circuit 31 and second circuit 32.

Integrated circuit 41 is, for example, a semiconductor integrated circuit (IC) or a large-scale integrated circuit (LSI). Integrated circuit 41 is included in a personal computer, a server computer, or a microcontroller, for example.

A first end of first circuit 31 is electrically connected to power source PS1. In other words, electric circuit EC1 is electrically connected to power source PS1. A second end of first circuit 31 is electrically connected to an input terminal of DC/DC converter 43. Power source PS1 is a DC power source. Power source PS1 is a battery, for example. Power source PS1 supplies DC power to DC/DC converter 43.

A first end of second circuit 32 is electrically connected to an output terminal of DC/DC converter 43. A second end of second circuit 32 is electrically connected to integrated circuit 41. In other words, electric circuit EC1 is electrically connected to integrated circuit 41. DC/DC converter 43 converts DC power input from power source PS1 into DC power having a predetermined voltage, and outputs the DC power to integrated circuit 41.

Filter circuit 100 is provided on first circuit 31. In other words, filter circuit 100 electrically connects between power source PS1 and the input terminal of DC/DC converter 43.

Filter circuit 100 includes resonant circuit 101. Filter circuit 100 according to the present exemplary embodiment constitute only of resonant circuit 101.

Resonant circuit 101 includes input end T1, output end T2, inductance element 42, and capacitor 11. Capacitor 11 includes two internal capacitors 111, 112. Two internal capacitors 111, 112 are housed in one exterior body 14 (see FIG. 3) of capacitor 11. A plurality of first capacitor elements 10a (see FIG. 5), to be described later, are included in internal capacitor 111, and a plurality of second capacitor elements 10b (see FIG. 5) are included in internal capacitor 112.

Power source PS1 is electrically connected to input end T1. The input terminal of DC/DC converter 43 is electrically connected to output end T2. Input end T1 and output end T2 are part of the conductor making up first circuit 31. Input end T1 and output end T2 are connectors, and may be connected to other connectors provided to first circuit 31.

Inductance element 42 is a coil, for example. Inductance element 42 electrically connects between input end T1 and output end T2. In other words, a first end of inductance element 42 is electrically connected to input end T1, and a second end of inductance element 42 is electrically connected to output end T2.

An anode of internal capacitor 111 is electrically connected to the first end of inductance element 42 via first external electrode 21. More particularly, the anode of internal capacitor 111 is electrically connected to a connection point between the first end of inductance element 42 and input end T1. A cathode of internal capacitor 111 is electrically connected to conductor W3 (see FIG. 2) that is at the reference potential via third external electrode 231. In the present exemplary embodiment, the reference potential is the ground potential.

An anode of internal capacitor 112 is electrically connected to the second end of inductance element 42 via second external electrode 22. More particularly, the anode of internal capacitor 112 is electrically connected to a connection point between the second end of inductance element 42 and output end T2. The cathode of internal capacitor 112 is electrically connected to conductor W3 (see FIG. 2) that is at the reference potential via third external electrode 232.

In the manner described above, resonant circuit 101 forms π type filter. In other words, first external electrode 21 is electrically connected to the first end of inductance element 42, and second external electrode 22 is electrically connected to the second end of inductance element 42.

Electric circuit EC1 also includes capacitors 45, 48, in addition to capacitor 11. Each of the capacitors 45, 48 is an electrolytic capacitor. Electric circuit EC1 also includes inductor 44.

Inductor 44 electrically connects between the output terminal of DC/DC converter 43 and capacitor 45. Capacitor 45 electrically connects between second circuit 32 and conductor W3 (ground) (see FIG. 2) that is at the reference potential. Inductor 44 and capacitor 45 together form a low-pass filter.

Capacitor 48 electrically connects between second circuit 32 and conductor W3 (ground) at the reference potential. Capacitor 48 smooths the output voltage of DC/DC converter 43.

(2) Implementation of Capacitor and Inductance Element

Figure 2:
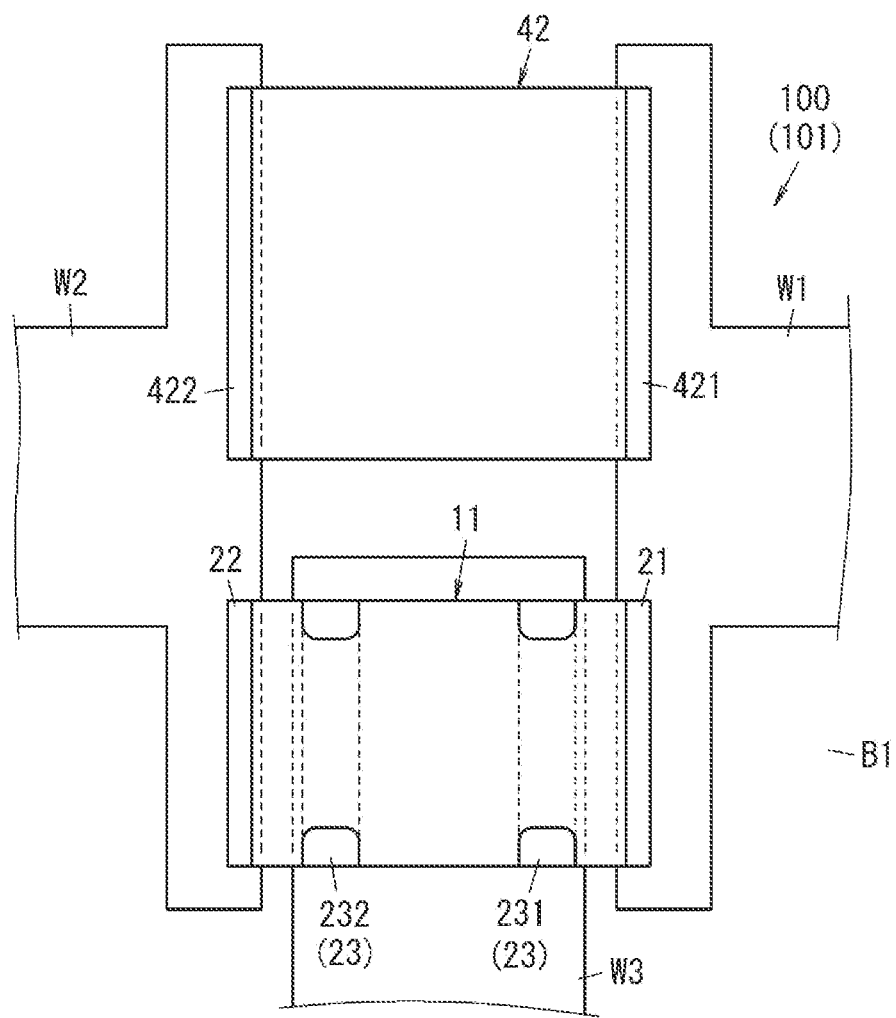
FIG. 2 is a plan view illustrating the filter circuit mounted on a substrate.

As illustrated in FIG. 2, capacitor 11 and inductance element 42 are mounted on the surface of substrate B1. Substrate B1 has conductors W1, W2, and W3. Conductor W1 includes input end T1 (see FIG. 1) of resonant circuit 101. Conductor W2 includes output end T2 (see FIG. 1) of resonant circuit 101. The potential of conductor W3 is the reference potential (ground potential). Conductor W3 is provided between conductor W1 and conductor W2.

Capacitor 11 is mounted on substrate B1 in such a manner that third surface 14c that is the bottom surface (see FIG. 4) faces a surface of substrate B1. First external electrode 21 of capacitor 11 is electrically connected to conductor W1. Second external electrode 22 is electrically connected to conductor W2. Third external electrodes 231, 232 are electrically connected to conductor W3.

Since first external electrode 21 and second external electrode 22 are equivalent, first external electrode 21 may also be electrically connected to conductor W2, and second external electrode 22 may also be electrically connected to conductor W1.

Inductance element 42 includes first electrode 421 serving as the first end and second electrode 422 serving as the second end. First electrode 421 is electrically connected to conductor W1. Second electrode 422 is electrically connected to conductor W2.

(3) Characteristics of Capacitors and Resonant Circuit

As mentioned above, capacitor 11 includes two internal capacitors 111, 112. The characteristics of capacitor 11 are defined as the characteristics of the parallel circuit of two internal capacitors 111, 112.

Capacitor 11 has an equivalent series inductance (ESL) of 100 [pH] or lower, under the condition of a frequency of 50 [MHz] or higher and 1000 [MHz] or lower.

Capacitor 11 has a capacitance of 10 [µF] or more.

Figure 5:
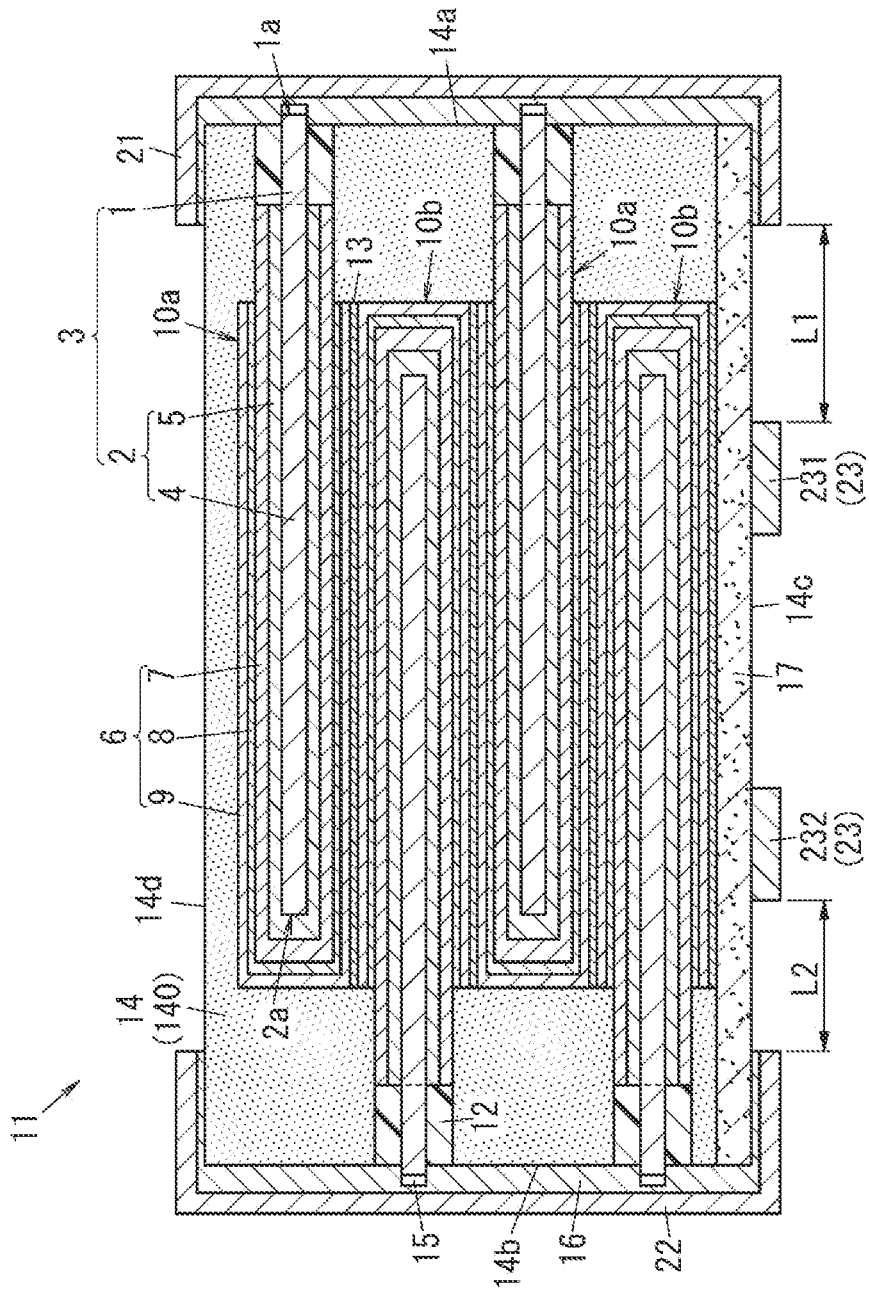
FIG. 5 is a schematic cross-sectional view of the electrolytic capacitor.

As illustrated in FIG. 5, capacitor 11 has a stacked structure in which first capacitor element 10a and second capacitor element 10b are stacked, as a configuration for reducing the ESL. More specifically, capacitor 11 has a stacked structure in which first capacitor element 10a and second capacitor element 10b are stacked alternately.

As a configuration for increasing the electrostatic capacitance, capacitor 11 has an end-face current collector structure in which at least a part of first external electrode 21 and at least a part of second external electrode 22 are provided on respective side surfaces of exterior body 14.

Figure 7:
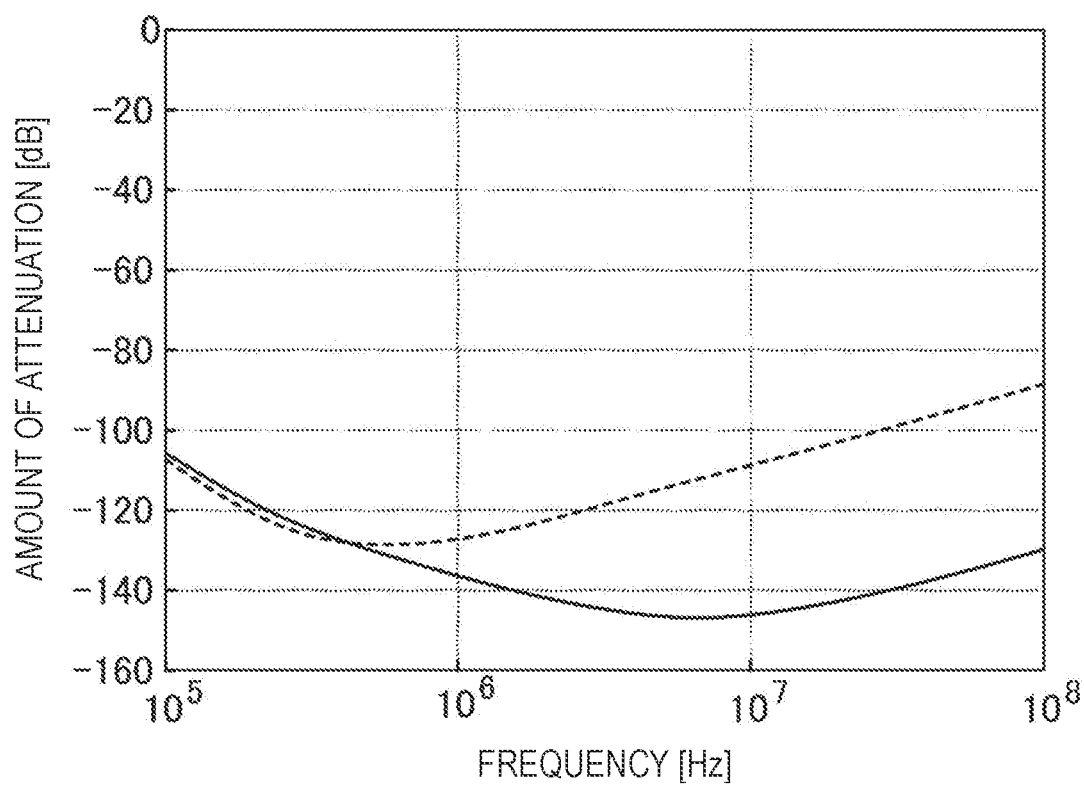
FIG. 7 is a characteristic diagram of the filter circuit.

The solid line in FIG. 7 represents an attenuation characteristic of resonant circuit 101 including capacitor 11 and inductance element 42. The broken line in FIG. 7 is an attenuation characteristic of a resonant circuit according to a comparative example. The resonant circuit according to the comparative example includes inductance element 42 and two-terminal conductive aluminum electrolytic capacitors (capacitance of 220 µF) provided on the respective sides of inductance element 42. In the present exemplary embodiment, by using capacitor 11 having a low ESL, the amount of attenuation can be increased across a wider band.

(4) Structure of Capacitor

A structure of capacitor 11 (hereinafter, also referred to as electrolytic capacitor 11) according to the present exemplary embodiment will now be described with reference to FIGS. 5 and 6.

[Electrolytic Capacitor]

Electrolytic capacitor 11 according to the exemplary embodiment of the present disclosure includes an element stacked body that is a stack of a plurality of capacitor elements 10, exterior body 14, first external electrode 21, second external electrode 22, and third external electrode 23 (231 and 232). Exterior body 14 includes sealing member 140 covering the element stacked body. Exterior body 14 according to the present exemplary embodiment further includes substrate 17. The bottom surface of substrate 17 serves as the bottom surface (third surface 14c) of exterior body 14.

Each of the plurality of capacitor elements 10 includes anode body 3 having a surface including porous part 5, a dielectric layer provided on at least a part of a surface of porous part 5, and cathode part 6 covering at least a part of the dielectric layer. Each of the plurality of capacitor elements 10 has first end portion 1a where anode body 3 is exposed, and second end portion 2a where anode body 3 is covered by cathode part 6, and at least the end face of first end portion 1a is exposed from exterior body 14.

In some of the plurality of capacitor elements 10, first end portions 1a face first surface 14a of exterior body 14, and in the others, first end portions 1a face second surface 14b that is different from first surface 14a of exterior body 14. Among such capacitor elements 10, one having first end portion 1a facing first surface 14a of exterior body 14 will be referred to as first capacitor element 10a, and one having first end portion 1a facing second surface 14b that is different from first surface 14a of exterior body 14 will be referred to as second capacitor element 10b. First end portion 1a of first capacitor element 10a is electrically connected to first external electrode 21. First end portion 1a of second capacitor element 10b is electrically connected to second external electrode 22.

With this configuration, currents flow through first capacitor element 10a and second capacitor element 10b in different directions with respect to each other. As a result, the magnetic fields are generated by the currents in different directions, so that the magnetic flux generated in the element stacked body decreases. Therefore, the ESL is reduced. Preferably, first surface 14a and second surface 14b may be surfaces of exterior body 14 facing each other. Furthermore, the magnetic flux generated in the element stacked body can be reduced effectively by stacking first capacitor element 10a and second capacitor element 10b alternately. Therefore, it is possible to reduce the ESL effectively.

The number of first capacitor elements 10a and the number of second capacitor elements 10b may be the same. When the number of first capacitor elements 10a is the same as the number of second capacitor elements 10b, the magnetic field generated by the current flowing through first capacitor element 10a and the magnetic field generated by the current flowing through second capacitor element 10b cancel out each other without any over or short, so that the magnetic flux generated in the element stacked body is reduced. In this manner, the ESL can be reduced easily.

Furthermore, the element stacked body and the external electrode may be electrically connected by electrically connecting the end face of first end portion 1a of each capacitor element 10 exposed from exterior body 14 to the external electrode (first external electrode 21 or second external electrode 22). The end face of first end portion 1a and the external electrode may be electrically connected by, for example, using an external electrode provided on first surface 14a or second surface 14b, or by electrically connecting an intermediate electrode (corresponding to anode electrode layer 16 described later) provided on first surface 14a or second surface 14b, to the external electrode. With such a configuration, it is not necessary to interpose another member for connecting first end portion 1a to the external electrode (first external electrode 21 or second external electrode 22) inside exterior body 14, so that the capacity of electrolytic capacitor 11 can be increased easily. In addition, in the current path from a part of anode body 3 not having cathode part 6 (anode lead-out part) to first external electrode 21 or second external electrode 22, the length of the path of current flowing in parallel with a stacked surface of the element stacked body is substantially equal to that of the anode lead-out part, and therefore, can be easily shortened. Therefore, the ESL resultant of the path of the current flowing in parallel with the stack surface of the element stacked body can be further reduced.

Third external electrode 23 (231 and 232) is electrically connected to cathode part 6 of capacitor element 10. For example, third external electrode 23 (231 and 232) is electrically connected to cathode part 6 on the outermost layer (that is, the lowermost layer or the uppermost layer) of the element stacked body. With this, a cathode terminal may be provided on the bottom surface of electrolytic capacitor 11. An anode terminal may also be provided on the bottom surface of electrolytic capacitor 11 by extending first external electrode 21 or second external electrode 22 onto the bottom surface of electrolytic capacitor 11. In this configuration, the current flowing through the extended portion of first external electrode 21 or second external electrode 22 flows in the opposite direction of the current flowing through the anode lead-out portions. Therefore, the magnetic field generated by the current flowing through the anode lead-out portions is canceled by the magnetic field generated by the current flowing through the extended portion of first external electrode 21 or second external electrode 22, so that the ESL of electrolytic capacitor 11 is further reduced. As a result, because the extended portion can shorten the distance by which the cathode terminal is separated from the first and/or second external electrodes, the ESL is improved. With these synergistic effects, the ESL is reduced significantly.

First end portion 1a may be electrically connected to first external electrode 21 or second external electrode 22 via contact layer 15. Contact layer 15 may be selectively formed on the end faces of first end portions 1a of the plurality of respective capacitor elements 10, for example. Contact layer 15 may connect first end portions 1a of the plurality of respective capacitor elements 10 to an intermediate electrode (anode electrode layer 16) or an external electrode provided in a manner covering first surface 14a or second surface 14b. By interposing contact layer 15, electrical connection between first end portions 1a and the external electrode can be established reliably. Therefore, reliability of electrolytic capacitor 11 can be improved.

First external electrode 21 and second external electrode 22 may face each other in the longitudinal direction of anode body 3, or may face each other in the short-hand direction. For example, first external electrode 21 and second external electrode 22 may be disposed on respective ends in the short-hand direction of one surface (e.g., the bottom surface) of exterior body 14, or may be disposed on respective ends of the longitudinal direction. In terms of reducing the ESL, first external electrode 21 and second external electrode 22 may face each other in the short-hand direction of anode body 3. By contrast, by disposing first external electrode 21 and second external electrode 22 in a manner facing each other in the longitudinal direction of anode body 3, it is easier to increase the distance by which first external electrode 21 or second external electrode 22 extends onto the bottom surface of electrolytic capacitor 11, to control the distance by which the cathode terminal is separated from the anode terminal, and to control the ESL to a desired level.

FIG. 5 is a cross-sectional view schematically illustrating a structure of electrolytic capacitor 11 according to the exemplary embodiment of the present disclosure. FIG. 6 is a cross-sectional view illustrating a structure of capacitor element 10 included in electrolytic capacitor 11 in FIG. 5. However, electrolytic capacitor 11 according to the present disclosure is not limited thereto.

Figure 6:
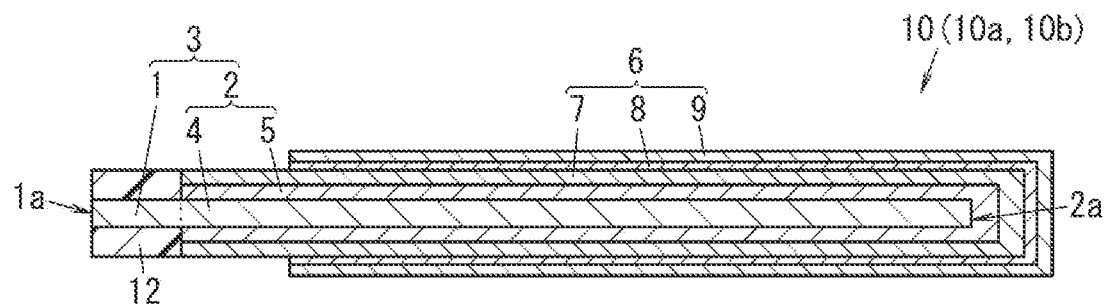
FIG. 6 is a schematic cross-sectional view of a capacitor element of the electrolytic capacitor.

As illustrated in FIGS. 5 and 6, electrolytic capacitor 11 includes a plurality of capacitor elements 10 (10a, 10b). Each capacitor element 10 includes anode body 3 and cathode part 6. Anode body 3 is, for example, a foil (anode foil). Anode body 3 has a surface including porous part 5, and porous part 5 has a surface at least a part of which is provided with a dielectric layer (not illustrated). Cathode part 6 covers at least a part of the dielectric layer.

In capacitor element 10, one end (first end portion) 1a is not covered by cathode part 6, and anode body 3 is exposed, whereas anode body 3 on the other end (second end portion) 2a is covered by cathode part 6. Hereinafter, the part of anode body 3 not covered by cathode part 6 will be referred to as first part 1, and the part of anode body 3 covered by cathode part 6 will be referred to as second part 2. An end of first part 1 corresponds to first end portion 1a, and an end of second part 2 corresponds to second end portion 2a. The dielectric layer is formed on a surface of porous part 5 that is provided at least on second part 2. Note that, first part 1 of anode body 3 is also referred to as an anode lead-out portion. Second part 2 of anode body 3 is also referred to a cathode forming portion.

More specifically, second part 2 includes core 4 and porous part (porous body) 5 formed by roughening (e.g., etching) the surface of core 4. First part 1 may, however, have or not have porous part 5 on the surface. The dielectric layer is provided along the surface of porous part 5. At least a part of the dielectric layer covers and is provided on inner wall surfaces of the pores of porous part 5.

Cathode part 6 includes solid electrolyte layer 7 covering at least a part of the dielectric layer, and a cathode lead-out layer covering at least a part of solid electrolyte layer 7. A surface of the dielectric layer has irregularities corresponding to the shape of the surface of anode body 3. Solid electrolyte layer 7 may have a shape by which such irregularities of the dielectric layer are filled. The cathode lead-out layer includes, for example, carbon layer 8 covering at least a part of solid electrolyte layer 7, and silver paste layer 9 covering carbon layer 8.

Second part 2 corresponds to a part of anode body 3 provided with solid electrolyte layer 7 with the dielectric layer (porous part 5) therebetween, and first part 1 corresponds to a part of anode body 3 on which no solid electrolyte layer 7 is provided with the dielectric layer (porous part 5) therebetween.

Insulating separation layer (or insulating member) 12 may be provided in a manner covering the surface of anode body 3, the part being a part of the area of anode body 3 not facing the cathode part 6 but sharing a border with cathode part 6. This separation layer restricts the contact between cathode part 6 and the exposed part (first part 1) of anode body 3. Separation layer 12 is, for example, an insulating resin layer.

In the example illustrated in FIG. 5, four capacitor elements 10 (10a, 10b) are stacked in such a manner that cathode parts 6 (second parts 2) thereof are placed on top of one another. However, there are two types of capacitor elements 10 having first part 1 of anode body 3 facing different directions. In FIG. 5, each first capacitor element 10a has anode body 3 with first part 1 facing one direction (rightwards in the drawing) with respect to second part 2. By contrast, each second capacitor element 10b has anode body 3 with first part 1 facing the direction opposite to the direction in which first part 1 of first capacitor element 10a faces (leftwards in the drawing), with respect to second part 2. First capacitor elements 10a and second capacitor elements 10b are stacked alternately, to form an element stacked body. In the plurality of capacitor elements 10 (10a, 10b), cathode parts 6 that are adjacent to each other in the stacked direction are electrically connected to each other via conductive adhesive layers 13. Adhesive layer 13 is formed using a conductive adhesive, for example. Adhesive layer 13 contains, for example, silver.

Electrolytic capacitor 11 includes the above-described element stacked body in which a plurality of capacitor elements 10 (10a, 10b) are stacked, exterior body 14 including sealing member 140 for covering the element stacked body, first external electrode 21, second external electrode 22, and third external electrode 23. In the element stacked body, the end face of first end portion 1a is exposed from exterior body 14.

Exterior body 14 has a substantially rectangular cuboid outer shape, and electrolytic capacitor 11 also has a substantially cuboid outer shape. Exterior body 14 has first surface 14a and second surface 14b opposite to first surface 14a. In the element stacked body, first end portion 1a of each first capacitor element 10a faces first surface 14a (that is, first end portion 1a is closer to first surface 14a than the second end portion 2a), and first end portion 1a of each second capacitor element 10b faces second surface 14b (that is, first end portion 1a is closer to second surface 14b than the second end portion 2a).

In electrolytic capacitor 11, each of the plurality of first end portions 1a (first parts 1) exposed from exterior body 14 is electrically connected to first external electrode 21 that extends along first surface 14a or second external electrode 22 that extends along second surface 14b. With such a configuration, it is not necessary to bundle the plurality of first parts 1 to form an anode of electrolytic capacitor 11, nor to ensure a length for bundling the plurality of first parts 1. In this manner, first parts 1 occupy a smaller proportion of anode body 3, so that a capacitance can be improved compared with a configuration in which the plurality of first parts 1 are bundled. In addition, the ESL contributed by first parts 1 is reduced. In addition, because the distance by which third external electrode 23 is separated from first external electrode 21 and/or second external electrode 22 can be shortened, the ESL is improved.

In electrolytic capacitor 11, each of end faces of the plurality of first end portions 1a exposed from exterior body 14 is covered by contact layer 15. Anode electrode layer 16 covers contact layers 15, and first surface 14a and second surface 14b of exterior body 14. First external electrode 21 and second external electrode 22 cover anode electrode layer 16, so that the plurality of first end portions 1a (first parts 1) are electrically connected to first external electrode 21 or second external electrode 22 thereby. Specifically, anode electrode layer 16 covering first surface 14a of exterior body 14 is interposed between contact layer 15 and first external electrode 21, and anode electrode layer 16 covering second surface 14b of exterior body 14 is interposed between contact layer 15 and second external electrode 22.

In the example in FIG. 5, the element stacked body is supported on substrate 17. Substrate 17 is, for example, a layered substrate the upper surface and the lower surface of which have conductive wiring patterns, and the wiring pattern on the upper surface and the wiring pattern on the lower surface are electrically connected by a through hole. The wiring pattern on the upper surface is electrically connected to cathode part 6 of capacitor element 10 in the lowermost layer of the stack, and the wiring pattern on the lower surface (third surface 14c) is electrically connected to third external electrode 23 (231 and 232). Therefore, third external electrode 23 is electrically connected to cathode part 6 of each capacitor element 10 of the element stacked body via substrate 17. In such a configuration, the number, shape, and arrangement of the third external electrodes 23 may be set in any way, depending on the wiring pattern provided on the lower surface. Third external electrode 23 is provided on substrate 17 by plating, for example, so that substrate 17 including third external electrode 23 may be handled as one member.

At least a part of third external electrode 23 is exposed on the bottom surface of electrolytic capacitor 11. The exposed portion on the bottom surface of third external electrode 23 serves as a cathode terminal of electrolytic capacitor 11. In the example in FIG. 5, two third external electrodes 23 are provided separated from each other, and third external electrodes 23 are exposed in a plurality of respective areas.

A part of first external electrode 21 is bent along the bottom surface of exterior body 14 and exposed on the bottom surface of electrolytic capacitor 11. Similarly, a part of second external electrode 22 is bent along the bottom surface of exterior body 14, in a manner facing the bent part of first external electrode 21, and is exposed on the bottom surface of electrolytic capacitor 11. These exposed portions of first external electrode 21 and second external electrode 22 on the bottom surface serve as an anode terminal of electrolytic capacitor 11. In other words, in the present exemplary embodiment, electrolytic capacitor 11 has two anode terminals that are separated from each other. A cathode terminal may be provided in a manner interposed between the two anode terminals that are separated from each other.

The ESL of electrolytic capacitor 11 depends on distance L1 by which first external electrode 21 is separated from third external electrode 23 on the bottom surface, and distance L2 by which second external electrode 22 is separated from third external electrode 23 on the bottom surface. When separation distances L1 and L2 are shorter, it is more likely for the ESL to be smaller. In order to reduce the ESL, a plurality of third external electrodes 23 may be disposed on the bottom surface. In such a configuration, one of the plurality of third external electrodes 23 (third external electrode 231) may be disposed closer to first external electrode 21, and the other one of the plurality of third external electrodes 23 (third external electrode 232) may be disposed closer to second external electrode 22. In this manner, the ESL can be reduced effectively. Separation distances L1 and L2 may be, for example, 0.4 mm to 1.1 mm. Note that "including a plurality of third external electrodes 23" means that third external electrodes 23 are exposed in a plurality of separated areas, and is not limited to a configuration in which the plurality of third external electrodes 23 are provided separated from each other. Two or more of the plurality of third external electrodes 23 may be continuous and electrically connected inside exterior body 14. The plurality of third external electrodes 23 may be provided on different surfaces of exterior body 14, e.g., one provided on the top surface and the other provided on the bottom surface.

Figure 4:
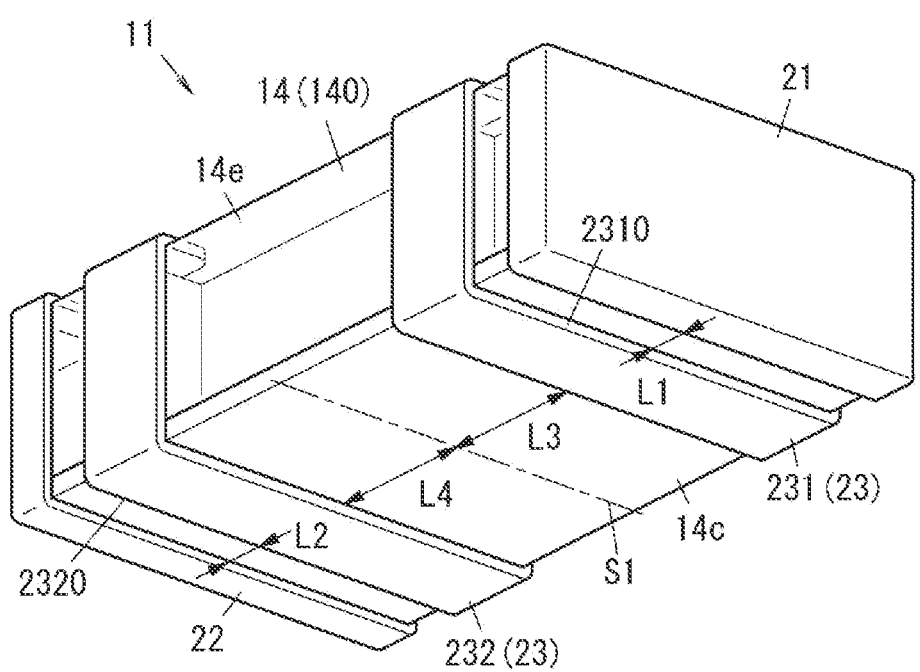
FIG. 4 is a perspective view of the electrolytic capacitor.

As illustrated in FIG. 4, in a view in the normal direction of third surface 14c (bottom surface), distance L1 between edge 2310 of third external electrode 23 facing first external electrode 21 and first external electrode 21 is preferably shorter than distance L3 between line segment S1 that is orthogonal to the direction in which first surface 14a and second surface 14b are arranged (left-right direction) and that divides exterior body 14 into halves, and edge 2310 of third external electrode 23. When a plurality of third external electrodes 23 are provided as in the present exemplary embodiment, edge 2310 of third external electrode 23 facing first external electrode 21 means an edge of third external electrode 231 having an edge facing first external electrode 21, among the plurality of third external electrodes 23.

Furthermore, in a view in the normal direction of third surface 14c (bottom surface), distance L2 between edge 2320 of third external electrode 23 facing second external electrode 22 and second external electrode 22 is preferably shorter than distance L4 between line segment S1 that is orthogonal to the direction in which first surface 14a and second surface 14b are arranged (left-right direction) and that divides exterior body 14 into two halves, and edge 2320 of third external electrode 23. When a plurality of third external electrodes 23 are provided as in the present exemplary embodiment, edge 2320 of third external electrode 23 facing second external electrode 22 means an edge of third external electrode 232 having an edge facing second external electrode 22, among the plurality of third external electrodes 23.

In electrolytic capacitor 11, the direction of the current flowing through first capacitor element 10a is opposite to the direction of the current flowing through second capacitor element 10b. Thus, a magnetic field generated by a current flowing through first capacitor element 10a and a magnetic field generated by a current flowing through second capacitor element 10b cancel out each other, and a magnetic flux generated in electrolytic capacitor 11 decreases. As a result, the ESL is reduced.

At the same time, in parts of first part 1 and second part 2 where capacitor elements 10 do not overlap each other (in FIG. 5, a portion not covered by the cathode lead-out layer), the effect of canceling out the magnetic fields does not occur, but in electrolytic capacitor 11 according to the present exemplary embodiment, it is easy to reduce the length of first part 1. Thus, contributions of these parts to the ESL is reduced. Furthermore, since first external electrode 21 and second external electrode 22 extend along the bottom surface of exterior body 14, contributions of these parts to the ESL is reduced. With these effects, the ESL of electrolytic capacitor 11 can be improved significantly.

These elements of electrolytic capacitor 11 according to the exemplary embodiment will now be described more in detail.

(Anode Body 3)

Anode body 3 can contain a valve metal, an alloy containing a valve metal, and a compound containing a valve metal (such as an intermetallic compound), for example. These materials can be used singly, or two or more of these materials may be used in combination. As the valve metal, aluminum, tantalum, niobium, or titanium may be used, for example. Anode body 3 may be a foil of a valve metal, an alloy containing a valve metal, or a compound containing a valve metal, or may be a porous sintered body of a valve metal, an alloy containing a valve metal, or a compound containing a valve metal.

When a metal foil is used for anode body 3, porous part 5 is usually formed at least on a surface of second part 2 of anode foil to increase a surface area. Second part 2 includes core 4 and porous part 5 formed on a surface of the core 4. Porous part 5 may be formed by roughening, e.g., etching the surface of at least second part 2 of the anode foil. It is also possible to dispose a predetermined masking member on the surface of first part 1 before roughening the surface by etching, for example. It is also possible to roughen the entire surface of the anode foil by etching. In the former case, the resultant anode foil has no porous part 5 on the surface of first part 1 and has porous part 5 on the surface of second part 2. In the latter case, porous part 5 is formed not only on the surface of second part 2 but also on the surface of first part 1. As the etching, any known method may be used, and an example thereof includes electrolytic etching. The masking member is not limited to any particular member, but an insulator such as resin is preferable. The masking member may be a conductor containing a conductive material, although the masking member is removed before solid electrolyte layer 7 is formed.

When the entire surface of the anode foil is roughened, porous part 5 is formed on the surface of first part 1. Therefore, adhesion between porous part 5 and sealing member 140 may become insufficient, and air (specifically, oxygen and moisture) may get into electrolytic capacitor 11 through the part where porous part 5 is in contact with sealing member 140. In order to suppress insufficiency in the adhesion, porous first part 1 may be compressed in advance, so that the pores of porous part 5 are crushed. In this manner, it is possible to suppress the entry of the air into electrolytic capacitor 11 from first end portion 1a exposed from sealing member 140 through porous part 5, and to suppress a reduction in the reliability of electrolytic capacitor 11 due to the entry of the air.

(Dielectric Layer)

The dielectric layer is formed, for example, by anodizing the valve metal at least on the surface of second part 2 of anode body 3, by applying chemical conversion treatment thereto. The dielectric layer contains an oxide of the valve metal. For example, when aluminum is used as the valve metal, the dielectric layer contains aluminum oxide. The dielectric layer is formed at least on the surface of second part 2 having porous part 5 (including the inner wall surfaces of the pores of porous part 5). The method of forming the dielectric layer is not limited to this, and any method may be used as long as an insulating layer functioning as a dielectric layer is formed on the surface of second part 2. The dielectric layer may also be formed on the surface of first part 1 (e.g., on porous part 5 of the surface of first part 1).

(Cathode Part 6)

Cathode part 6 includes solid electrolyte layer 7 covering at least a part of the dielectric layer, and a cathode lead-out layer covering at least a part of solid electrolyte layer 7.

(Solid Electrolyte Layer 7)

Solid electrolyte layer 7 contains, for example, a conductive polymer. Examples of the conductive polymer include polypyrrole, polythiophene, polyaniline, and derivatives thereof. Solid electrolyte layer 7 can be formed on the dielectric layer by chemical polymerization and/or electrolytic polymerization of a raw material monomer, for example. Alternatively, the dielectric layer may also be formed by applying a solution in which the conductive polymer is dissolved or a dispersion liquid in which the conductive polymer is dispersed to the dielectric layer. Solid electrolyte layer 7 may contain a manganese compound.

(Cathode Lead-Out Layer)

The cathode lead-out layer includes, for example, a carbon layer 8 and silver paste layer 9. Carbon layer 8 is only required to be conductive, and may be made of a conductive carbon material such as graphite, for example. Carbon layer 8 is formed by, for example, applying a carbon paste to at least a part of the surface of solid electrolyte layer 7. For silver paste layer 9, for example, a composition containing silver powder and a binder resin (e.g., epoxy resin) may be used. Silver paste layer 9 is formed by, for example, applying a silver paste onto the surface of carbon layer 8. The configuration of the cathode lead-out layer is not limited thereto, and may be any configuration having a current collector function.

(Separation Layer 12)

Insulating separation layer 12 may be provided to electrically separate first part 1 from cathode part 6. Separation layer 12 may be provided near cathode part 6, in a manner covering at least a part of the surface of first part 1. Preferably, separation layer 12 is in close adhesion with first part 1 and sealing member 140. In this manner, entry of the air into electrolytic capacitor 11 can be suppressed. Separation layer 12 may be disposed on first part 1 with the dielectric layer therebetween.

Separation layer 12 contains, for example, a resin, and resins to be explained later as examples of sealing member 140 may be used. The dielectric layer provided on porous part 5 of first part 1 may be compressed and densified to provide insulation.

Separation layer 12 in close adhesion with first part 1 can be achieved by, for example, bonding a sheet-like insulating member (e.g. resin tape) to first part 1. When an anode foil having porous part 5 on the surface is used, porous part 5 of first part 1 may be compressed and flattened before bringing the insulating member into close adhesion with first part 1. The sheet-like insulating member preferably has an adhesive layer on a surface that is to be bonded to first part 1.

The insulating member in close adhesion with first part 1 may be achieved by applying liquid resin to first part 1, or impregnating first part 1 therewith. In the method using the liquid resin, the insulating member is formed in such a manner that the irregularities on the surface of porous part 5 of first part 1 are filled thereby. Because liquid resin easily gets into the recesses on the surface of porous part 5, inside of the recesses can be easily filled with the insulating member. As the liquid resin, a curable resin composition examples of which will be described in a fourth step below may be used.

(Sealing Member 140)

Sealing member 140 of exterior body 14 preferably contains, for example, a cured product of a curable resin composition, and may contain a thermoplastic resin or a composition containing a thermoplastic resin.

Sealing member 140 may be formed using, for example, a molding technique such as injection molding. Sealing member 140 may be formed, for example, by using a predetermined mold and filling a predetermined portion of the mold with a curable resin composition or a thermoplastic resin (composition) in such a manner that capacitor element 10 is covered thereby.

The curable resin composition may contain a filler, a curing agent, a polymerization initiator, and/or a catalyst, in addition to the curable resin. Examples of the curable resin include thermosetting resins. The curing agent, the polymerization initiator, the catalyst, and the like are selected as appropriate, depending on the type of the curable resin.

As the curable resin composition and the thermoplastic resin (composition), those examples of which will be described in a third step below may be used.

From the viewpoint of adhesion between separation layer 12 and sealing member 140, the insulating member and sealing member 140 preferably both contain resin. Sealing member 140 can adhere closely with an insulating member containing a resin, compared with first part 1 containing a valve metal, or the dielectric layer containing an oxide of the valve metal.

More preferably, separation layer 12 and sealing member 140 contain the same resin. In this case, adhesion between separation layer 12 and sealing member 140 is further improved, so that the entry of the air into electrolytic capacitor 11 is further suppressed. An example of the same resin contained in separation layer 12 and sealing member 140 includes an epoxy resin.

From the viewpoint of enhancing the strength and the like of sealing member 140, preferably, sealing member 140 contains a filler. By contrast, it is preferable for separation layer 12 to contain a filler having a particle diameter smaller than that of sealing member 140, and more preferable for the separation layer 12 not to contain any filler. When separation layer 12 is formed by impregnating first part 1 with a liquid resin, the liquid resin preferably contains a filler having a particle size smaller than that of sealing member 140, and more preferably, the liquid resin does not contain any filler. With such a liquid resin, the recesses on the surface of porous part 5 of first part 1 can be deeply impregnated with the resin, so that separation layer 12 can be formed easily. In addition, liquid resin enables thin separation layer 12 to be formed so as to allow the plurality of capacitor elements 10 to be stacked.

(Contact Layer 15)

Contact layer 15 may be formed in a manner covering the end face of first end portion 1a of anode body 3. Preferably, contact layer 15 may be formed in a manner covering only the surface of first end portion 1a that is exposed from sealing member 140, and covering the surface of sealing member 140 (and separation layer 12) that is a resin material as little as possible.

Contact layer 15 may contain a metal having a lower ionization tendency than the metal from which anode body 3 is made. For example, when anode body 3 is made of aluminum (Al) foil, contact layer 15 may be made of a material containing Zn, Ni, Sn, Cu, or Ag, for example. Such a material inhibits formation of a strong oxide film on the surface of contact layer 15, so that the electrical connection can be established more reliably, compared with the configuration in which the portion of anode body 3 exposed on first end portion 1a is directly connected to the external electrode.

An alloy layer may be formed on the interface between contact layer 15 and anode body 3. For example, when anode body 3 is an aluminum (Al) foil, Cu, Zn, or Ag, having atomic spacing near that of Al, can form an alloy layer on the interface, as a result of intermetallic bonding with Al. In this manner, the strength of bonding with anode body 3 can be further enhanced. Contact layer 15 may be made from a single element metal of the element mentioned above or an alloy such as bronze or brass, or may be formed as a stack of a plurality of metal layers of different single elements (e.g., a layered structure of a Cu layer and an Ag layer).

When contact layer 15 is to be formed, it is preferable for sealing member 140 not to contain a filler, or if sealing member 140 contains a filler, it is preferable for the Young's modulus of the filler to be lower than the Young's modulus of contact layer 15. In this manner, formation of contact layer 15 on the surface of sealing member 140 is suppressed, and contact layer 15 can be formed selectively on the end face of first end portion 1a.

Contact layer 15 may be formed by cold spraying, thermal spraying, plating, or vapor deposition, for example. With cold spraying, for example, metal particles in the solid state are brought into collision with the surface (first surface 14a and/or second surface 14b) of the sealing member 140 where the surface of first end portion 1a is exposed, to cause the metal particles to be fixed to the surface by plastic deformation, so that contact layer 15 containing the metal of the metal particles is formed on the end face of first end portion 1a. At this time, if the Young's modulus of the metal particles is higher than the Young's modulus of a constituent of sealing member 140 (e.g., the filler), plastic deformations of the metal particles having collided with the surface of sealing member 140 on the surface of sealing member 140 are suppressed, so that the metal particles become less fixed to the surface of sealing member 140. At least a part of energy resultant of the collision is used to break sealing member 140, to scrape off a part of the resin. As a result, it is possible to form contact layer 15 selectively on the end face of first end portion 1a of anode body 3, and to roughen the surface of sealing member 140 (first surface 14a and/or second surface 14b) at the same time.

(Anode Electrode Layer 16)

Anode electrode layer 16 may be interposed between contact layer 15 and the external electrode (first external electrode 21 or second external electrode 22). Anode electrode layer 16 may cover first surface 14a or second surface 14b of exterior body 14, and may be electrically connected to first end portion(s) 1a of capacitor element(s) 10 via contact layer 15, as necessary.

Anode electrode layer 16 may include a layer of conductive resin having conductive particles mixed. The conductive resin layer can be formed by applying a conductive paste containing conductive particles and a resin material onto first surface 14a or second surface 14b of exterior body 14, and drying the conductive paste. A resin material is suitable for being bonded to the material of exterior body 14 and anode body 3 (contact layer 15), and capable of enhancing bonding strength by chemical bonding (e.g., hydrogen bonding). As the conductive particles, for example, metal particles such as those of silver or copper, or particles of a conductive inorganic material such as those of carbon may be used.

Anode electrode layer 16 may be a metal layer. In that case, anode electrode layer 16 may be formed by using electrolytic plating, electroless plating, sputtering, vacuum vapor deposition, chemical vapor deposition (CVD), cold spraying, or thermal spraying.

Anode electrode layer 16 may cover apart of a surface (e.g., atop or bottom surface) orthogonal to first surface 14a and second surface 14b of exterior body 14.

Roughness Ra of the surface of exterior body 14 covered by anode electrode layer 16 may be 5 micrometers or more. With such setting, the contact area between anode electrode layer 16 and exterior body 14 is increased, and the adhesion between anode electrode layer 16 and exterior body 14 is improved by the anchoring effect, so that the reliability can be further enhanced.

(External Electrode)

First to third external electrodes 21 to 23 are preferably metal layers. These metal layers are, for example, plated layers. The metal layers contain, for example, at least one selected from the group consisting of nickel (Ni), copper (Cu), zinc (Zn), tin (Sn), silver (Ag), and gold (Au). To form first to third external electrodes 21 to 23, for example, a film formation technique such as an electrolytic plating, electroless plating, sputtering, vacuum vapor deposition, chemical vapor deposition (CVD), cold spraying, or thermal spraying may be used.

Each of first to third external electrodes 21 to 23 may have a layered structure of a Ni layer and a tin layer, for example. Each of first to third external electrodes 21 to 23 may be any metal at least the outer surface of which has excellent wettability with solder. Examples of such a metal include Sn, Au, Ag, and Pd.

Each of first external electrode 21 and second external electrode 22 may be formed by bonding a Cu cap, having a Sn film formed thereon in advance, to anode electrode layer 16.

First external electrode 21 and second external electrode 22 together form an anode terminal of electrolytic capacitor 11. When electrolytic capacitor 11 is mounted on substrate 17, both first external electrode 21 and second external electrode 22 need to be bonded to an electrode on substrate 17. However, first external electrode 21 and second external electrode 22 may be electrically connected to each other via a surface of exterior body 14 other than first surface 14a and second surface 14b. In such a configuration, only one of first external electrode 21 and second external electrode 22 may be connected to the electrode on substrate 17 at the time of mounting electrolytic capacitor 11 on substrate 17.

[Method of Manufacturing Electrolytic Capacitor 11]

The electrolytic capacitor 11 according to the exemplary embodiment of the present disclosure can be manufactured by, for example, a manufacturing method including a first step of preparing anode body 3; a second step of obtaining a plurality of capacitor elements 10; a third step of obtaining an element stacked body that is a stack of the plurality of capacitor elements 10; a fourth step of covering the element stacked body with sealing member 140; a fifth step of forming an end face of first part 1 and exposing the end face from sealing member 140; and a sixth step of electrically connecting the end face of first part 1 to an external electrode. The manufacturing method may further include a step of disposing separation layer 12 (insulator member) on a part of anode body 3 (separation layer disposing step). These steps included in the method of manufacturing electrolytic capacitor 11 will now be described.

(First Step)

In the first step, anode body 3 having a surface with a dielectric layer is prepared. More specifically, anode body 3 including first part 1 including one end and second part 2 including the other end opposite to one end and having a dielectric layer formed at least on a surface of second part 2 is prepared. For example, the first step includes a step of forming porous part 5 on a surface of anode body 3, and a step of forming a dielectric layer on a surface of porous part 5. More specifically, anode body 3 used in the first step has first part 1 including an end to be removed (the one end) and second part 2 including second end portion 2a (the other end). Preferably, porous part 5 is provided at least on the surface of second part 2.

Porous part 5 on the surface of anode body 3 may be formed in any way as long as irregularities can be formed on the surface of anode body 3, e.g., by roughening the surface of anode foil by etching (e.g., electrolytic etching).

The dielectric layer may be formed by applying chemical conversion treatment to anode body 3. The chemical conversion treatment may be applied by, for example, immersing anode body 3 in a chemical conversion solution so that the surface of anode body 3 is impregnated with the chemical conversion solution, and applying a voltage between anode body 3 as an anode and a cathode immersed in the chemical conversion solution. When the surface of anode body 3 has porous part 5, the dielectric layer is formed on the irregular surface of porous part 5.

(Separation Layer Disposing Step)

When electrolytic capacitor 11 including separation layer 12 (insulating member) is to be manufactured, a step of disposing separation layer 12 (insulating member) may be performed, after the first step and before the second step. In this step, an insulating member is disposed on a part of anode body 3. More specifically, in this step, an insulating member is disposed on first part 1 of anode body 3, with a dielectric layer interposed therebetween. The insulating member is disposed so as to isolate first part 1 from cathode part 6 that is to be formed in a subsequent step.

In the separation layer disposing step, a sheet-like insulating member (e.g., resin tape) may be bonded to a part (e.g., first part 1) of anode body 3. Even when anode body 3 having a surface with porous part 5 is used, by compressing and flattening the irregularities on the surface of first part 1, it is possible to bring the insulating member into close adhesion with to first part 1. The sheet-like insulating member preferably has an adhesive layer on a surface that is to be bonded to first part 1.

In addition to the above, in the separation layer disposing step, an insulating member may be formed by coating or impregnating a part (e.g., first part 1) of anode body 3 with a liquid resin. For example, the liquid resin is applied or anode body 3 is impregnated with liquid resin, and then the liquid resin is cured. With this, the insulating member can be brought into close adhesion with first part 1, easily. As the liquid resin, a curable resin composition examples of which will be explained in the fourth step (of forming sealing member 140), or a resin solution obtained by dissolving a resin in a solvent may be used, for example.

When the surface of anode body 3 has porous part 5, it is preferable to apply liquid resin to a part of the surface of porous part 5 of anode body 3 (e.g., the surface of first part 1), or to impregnate such a part with liquid resin. In this manner, an insulating member filling the irregularities on the surface of porous part 5 of first part 1 can be formed easily. Because liquid resin easily gets into the recesses on the surface of porous part 5, inside of the recesses can be easily filled with the insulating member. In this manner, the insulating member protects porous part 5 on the surface of anode body 3, and suppresses collapse of porous part 5 of anode body 3 in the fourth step in which anode body 3 is partially removed with sealing member 140. Since the insulating member is in close adhesion with the surface of porous part 5 of anode body 3, the insulating member is less likely to peel off from the surface of porous part 5 of anode body 3 in the fourth step in which anode body 3 is partially removed with sealing member 140.

(Second Step)

In the second step, cathode part 6 is formed on anode body 3 to obtain capacitor element 10. When the insulating member is to be provided in the sixth step, cathode part 6 is formed in a portion of anode body 3 where the insulating member is not disposed in the second step, to obtain capacitor element 10. More specifically, in the second step, at least a part of the dielectric layer on the surface of second part 2 of anode body 3 is covered by cathode part 6.

The step of forming cathode part 6 includes, for example, a step of forming a solid electrolyte covering at least a part of the dielectric layer, and a step of forming a cathode lead-out layer covering at least a part of solid electrolyte layer 7.

Solid electrolyte layer 7 can be formed on the dielectric layer by chemical polymerization and/or electrolytic polymerization of a raw material monomer, for example. Solid electrolyte layer 7 may be formed by attaching a treatment liquid containing a conductive polymer to the dielectric layer, and then drying the treatment liquid. The treatment liquid may further contain other components such as a dopant. As the conductive polymer, poly (3,4-ethylenedioxythiophene) (PEDOT) is used, for example. As the dopant, for example, polystyrene sulfonic acid (PSS) is used.

The treatment liquid is a dispersion liquid or a solution of the conductive polymer. Examples of the dispersion medium (solvent) include water, an organic solvent, and a mixture thereof.

The cathode lead-out layer can be formed by, for example, sequentially layering carbon layer 8 and silver paste layer 9 on the solid electrolyte layer.

(Third Step)

In the third step, a plurality of capacitor elements 10 are stacked to obtain an element stacked body. In this step, for example, cathode parts 6 of the plurality of capacitor elements 10 are placed on top of each other, with a conductive adhesive interposed therebetween, in such a manner that first parts 1 of adjacent capacitor elements 10 face opposite directions alternately, to obtain an element stacked body.

The element stacked body is then placed on a layered substrate (substrate 17) the upper surface and the lower surface of which have wiring patterns, with a conductive adhesive interposed between the element stacked body and the substrate. Third external electrode 23 is formed in advance on the layered substrate on the side opposite to the side on which the element stacked body is placed. By placing the element stacked body, third external electrode 23 is electrically connected to cathode parts 6 of capacitor elements 10 included in the element stacked body, via the wiring patterns formed on the layered substrate and the through holes connecting the wiring patterns on the upper surface to the wiring patterns on the lower surface of the layered substrate.

Alternatively, for example, the element stacked body and third external electrode 23 may be electrically connected by bonding plate-like third external electrode 23 having a predetermined shape to the surface of cathode part 6 exposed in the lowermost layer or the uppermost layer of the element stacked body, via a conductive paste or the like.

Third external electrode 23 may be formed using electrolytic plating, electroless plating, physical vapor deposition, chemical vapor deposition, cold spraying, and/or thermal spraying.

(Fourth Step)

In the fourth step, the element stacked body is covered by sealing member 140. At this time, third external electrode 23 is not entirely covered by sealing member 140, and at least a part of third external electrode 23 remains exposed. Sealing member 140 may be formed by injection molding, for example. Sealing member 140 may be formed, for example, by using a predetermined mold and filling a predetermined portion with a curable resin composition or a thermoplastic resin (composition) in a manner covering the element stacked body.

The curable resin composition may contain a filler, a curing agent, a polymerization initiator, and/or a catalyst, in addition to the curable resin. Examples of the curable resin include an epoxy resin, a phenol resin, a urea resin, polyimide, polyamideimide, polyurethane, diallyl phthalate, and unsaturated polyester. Examples of the thermoplastic resin include polyphenylene sulfide (PPS) and polybutylene terephthalate (PBT). It is also possible to use a thermoplastic resin composition containing a thermoplastic resin and a filler.

As the filler, for example, insulating particles and/or fibers are preferable. Examples of the insulating material included in the filler include insulating compounds (e.g., oxides) such as silica and alumina, glass, and mineral materials (e.g., talc, mica, or clay). Sealing member 140 may contain one type of these fillers, or may contain two or more types of these fillers in combination.

(Fifth Step)

In the fifth step, after the fourth step, the end faces of the first parts 1 are formed and exposed from the sealing member 140. More specifically, at least a part of anode body 3 is removed together with sealing member 140 on both end sides of the element stacked body, and at least first end portion 1a (specifically, the end face of first end portion 1a) of anode body 3 is exposed from sealing member 140 on both of first surface 14a and second surface 14b. Examples of the method for exposing first end portion 1a from sealing member 140 include a method of covering capacitor element 10 with sealing member 140, and then polishing a surface of sealing member 140 or cutting off a part of sealing member 140 in such a manner that first end portion 1a is exposed from sealing member 140. A part of first part 1 may be cut off with a part of sealing member 140. With this approach, first end portion 1a having a surface having neither porous part 5 nor a natural oxide film can be exposed more easily from sealing member 140, and a highly reliable connection with low resistance can be achieved between first part 1 and the external electrode. As a method for cutting sealing member 140, dicing is preferable. As a result, the exposed end face of first end portion 1a of first part 1 appears on the cut surface. Since the element stacked body includes two types of capacitor elements 10 with first parts 1 facing different directions, at the time of cutting off the parts of first parts 1 with a part of sealing member 140, it is necessary to cut first parts 1 at two locations. One of the two cut faces becomes first surface 14a, and the other becomes second surface 14b.

In the fifth step, anode body 3 and the insulating member may be partially removed with sealing member 140, on both end sides of the element stacked body, to expose the end face of first end portion 1a and the end face of the insulating member from sealing member 140. In this case, an end face of anode body 3 becomes exposed in flush with an end face of the insulating member from sealing member 140. Consequently, an end face of anode body 3 and end face of the insulating member can be easily exposed from sealing member 140 in flush with the surface of sealing member 140.

With the fifth step, it is possible to expose the end face of anode body 3 (first end portion 1a) with no natural oxide film from sealing member 140, and a highly reliable connection with low resistance between anode body 3 (more specifically, first part 1) and the external electrode can be achieved.

(Sixth Step)

In the sixth step, the end face (first end portion 1a) of each anode body 3 exposed from exterior body 14 is electrically connected to the external electrode. In this step, for example, first external electrode 21 is provided in a manner covering first surface 14a of exterior body 14, second external electrode 22 is provided in a manner covering second surface 14b, and these external electrodes are electrically connected to the end face of first end portion 1a. The electrical connection between the end face of first end portions 1a and the external electrodes may be formed by joining, for example, or by electrolytic plating, electroless plating, physical vapor deposition, chemical vapor deposition, cold spraying, and/or thermal spraying.

Before providing first external electrode 21 and second external electrode 22, a step of forming contact layer 15 on a surface that is an end face of first end portion 1a and/or a step of forming anode electrode layer 16 covering first surface 14a or second surface 14b of exterior body 14 may be performed. When anode electrode layer 16 is formed, first external electrode 21 and second external electrode 22 are formed in a manner covering anode electrode layer 16.

(Step of Forming Contact Layer 15)

Contact layer 15 may be formed by using methods such as cold spraying, thermal spraying, plating, or vapor deposition. Contact layer 15 may be formed in a manner selectively covering end face of first end portion 1a and covering first surface 14a and second surface 14b of exterior body 14 as little as possible.

When cold spraying is used, contact layer 15 is formed by causing metal particles to collide with the end face of each first end portion 1a at high speed. The metal particles may be particles of a metal having a lower ionization tendency than that of the metal of anode body 3. For example, when anode body 3 is an Al foil, the metal particles may be Cu particles. Cu particles colliding with the end face of first end portion 1a at high speed may break through the natural oxide film (Al oxide film) on the end face, and a metal bond between Al and Cu may be formed. As a result, a layer of an alloy of Al and Cu may be formed on the interface between contact layer 15 and first end portion 1a. The surface of contact layer 15, by contrast, is constituted by a layer of Cu that is a non-valve metal. Because the ionization tendency of Cu is lower than that of Al, the surface of contact layer 15 is less likely to oxidize. Therefore, it is possible to achieve a more reliable electrical connection between contact layer 15 and the external electrodes (or anode electrode layer 16).

Cold spraying is a technique in which metal particles having a size of several μm to several tens of m are accelerated to a subsonic or supersonic speed using compressed gas such as air, nitrogen, or helium, and are caused to collide with a base material that is in a solid phase state, to form a metal film thereby. As to the mechanism how the metal particles stick by cold spraying, although there is somewhat unknown part, it is generally considered that the energy of colliding metal particles causes the metal particles or the metal substrate to go through a plastic deformation, and the newly formed surface become exposed and activated on the metal surface.

With cold spraying, the metal particles may collide with first surface 14a and second surface 14b of exterior body 14, and the end face of separation layer 12 (insulating member) that are made of a non-metallic material. When the metal particles collide with a base material made of a resin base material, it is considered that bonding of the metal particles to the resin base material take place due to mechanical bonding, i.e., mainly resultant of plastically deformed metal particles fitting into the irregularities on the surface of the resin base material. Therefore, in order for a metal film to be formed on the surface of a resin base material, the following conditions need to be satisfied: (ia) the resin base material has sufficient hardness so that the energy of collision is efficiently spent in causing plastic deformation of the metal particles; (iia) a metal material and working conditions are selected such that the metal particles are more likely to go through plastic deformation; and (iiia) the resin base material is less likely to collapse by receiving the energy of collision.

By contrast, for the metal particles not to be fixed to the resin base material, following basic conditions need to be met: (ib) the resin base material is made elastic so that the colliding energy is not turned into an energy for causing a plastic deformation; (iib) a metal material and processing conditions are selected from a range allowing contact layer 15 to be formed on the end face of first end portion 1a but being less likely to cause a plastic deformation of the metal particles; and (iiib) the strength of the resin base material is reduced so that the base material breaks with an impact at a level lower than that at which a plastic deformation occurs.

In general, the plastic deformation of metal particles at the time of collision tends to be promoted when the Young's modulus of the metal particles is lower than the Young's modulus of the member (e.g., fillers) included in the resin base material, and the plastic deformation of the metal particles at the time of collision tends to be inhibited when the Young's modulus of the metal particles is higher. In the latter case, the collision energy of the metal particles fractures the resin base material brittlely, and the surface of the resin base material is scraped off thereby.

Therefore, by making the Young's modulus of the metal particles (which may also be referred to as contact layer 15) higher than the Young's modulus of the filler contained in the resin base material, it is possible to create a condition in which the metal particles hardly become fixed to the resin base material. In this manner, it is possible to inhibit formation of contact layer 15 on first surface 14a and second surface 14b of exterior body 14 and the end face of separation layer 12 (insulating member), and to form contact layer 15 selectively on the end face of first end portion 1a. In addition, by causing the metal particles to collide with first surface 14a and second surface 14b of exterior body 14, it is possible to achieve the effect of roughening first surface 14a and second surface 14b.

For example, when silica having a Young's modulus of 94 GPa is filled as sealing member 140 of exterior body 14, Cu particles and Ni particles may be used as metal particles having a Young's modulus higher than that of silica, and capable of easily being bonded with Al. However, the condition how the metal particles are fixed also varies depending on factors such as the shape, the size, and the temperature of the metal particles, and the size and filling rate of the silica filled in the resin material. Therefore, the present invention is not limited thereto.

(Step of Forming Anode Electrode Layer 16)

Anode electrode layer 16 may be formed in a manner covering an end face of first end portion 1a or contact layer 15, and covering first surface 14a and second surface 14b of exterior body 14. When separation layer 12 is provided, anode electrode layer 16 may be formed in a manner covering the end face of separation layer 12 (insulating member).

Anode electrode layer 16 may be formed by applying a conductive paste containing conductive particles and a resin material. Specifically, a conductive paste (e.g., silver paste) is applied to each end surface by dipping, or transferring, printing, or dispensing the paste on the end face, for example, and then cured at a high temperature, so that anode electrode layer 16 is formed thereby.

Anode electrode layer 16 that is a metal layer may also be formed by using a method such as electrolytic plating, electroless plating, sputtering, vacuum vapor deposition, chemical vapor deposition (CVD), cold spraying, or thermal spraying.

(First Modification)

Figure 8:
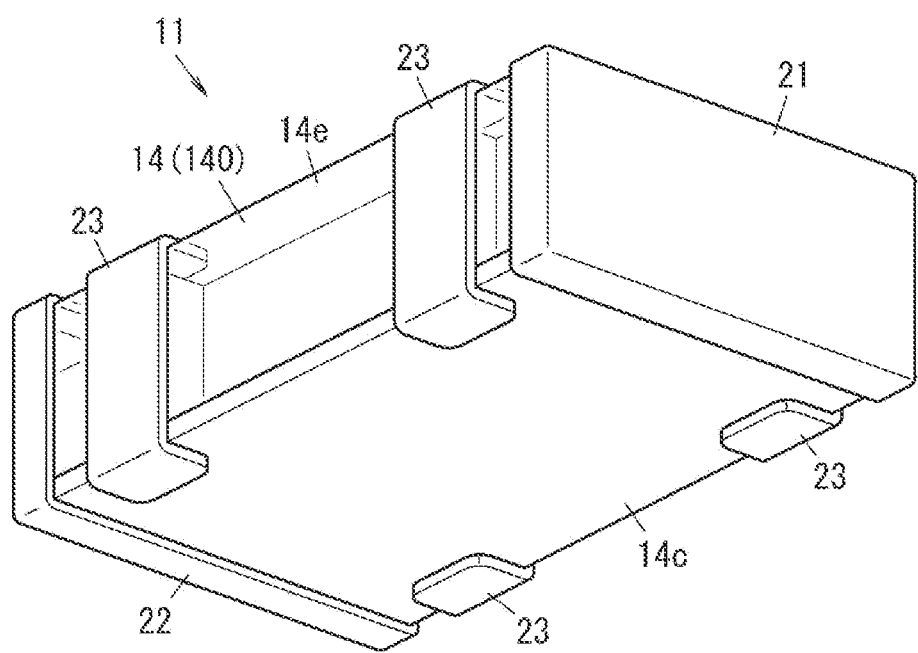
FIG. 8 is a perspective view of an electrolytic capacitor according to a first modification of the present disclosure.

A first modification related to the external electrodes will now be explained with reference to FIG. 8. Configurations that are the same as those in the exemplary embodiment are given the same reference signs, and descriptions thereof will be omitted as appropriate.

Capacitor 11 according to the first modification is different from that of the exemplary embodiment in including four third external electrodes 23. Main parts of two of third external electrodes 23 are provided on fifth surface 14e (front surface) of exterior body 14. Main parts of the remaining two of third external electrodes 232 are provided on sixth surface 14f (rear surface) of exterior body 14.

Each third external electrode 23 has a length in the up-down direction. The upper end of each of the third external electrodes 23 is bent toward the center of exterior body 14. The lower end of each of the third external electrodes 23 is bent toward the center of exterior body 14. As a result, a part of each third external electrode 23 is provided on third surface 14c (bottom surface). Another part of each third external electrode 23 is provided on fourth surface 14d (top surface).

(Second Modification)

Figure 9:
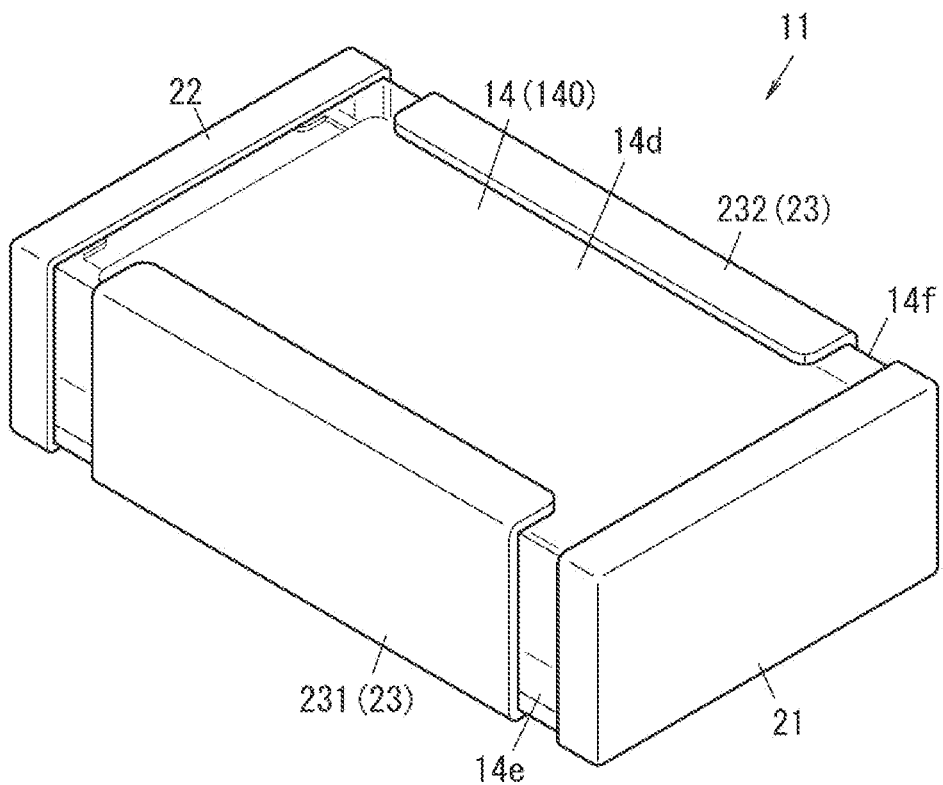
FIG. 9 is a perspective view of an electrolytic capacitor according to a second modification of the present disclosure.

A second modification related to the external electrodes will now be explained with reference to FIGS. 9 and 10. Configurations that are the same as those in the exemplary embodiment are given the same reference signs, and descriptions thereof will be omitted as appropriate.

Capacitor 11 according to this second modification is different from that of the exemplary embodiment in that two third external electrodes 23 (231 and 232) have different configurations. A main part of third external electrode 231 is provided on fifth surface 14e (front surface) of exterior body 14. A main part of third external electrode 232 is provided on sixth surface 14f (rear surface) of exterior body 14.

These two third external electrodes 23 have lengths in the up-down direction. The upper end of each of the third external electrodes 23 is bent toward the center of exterior body 14. The lower end of each of the third external electrodes 23 is bent toward the center of exterior body 14. As a result, a part of each third external electrode 23 is provided on third surface 14c (bottom surface). Another part of each third external electrode 23 is provided on fourth surface 14d (top surface).

Figure 10:
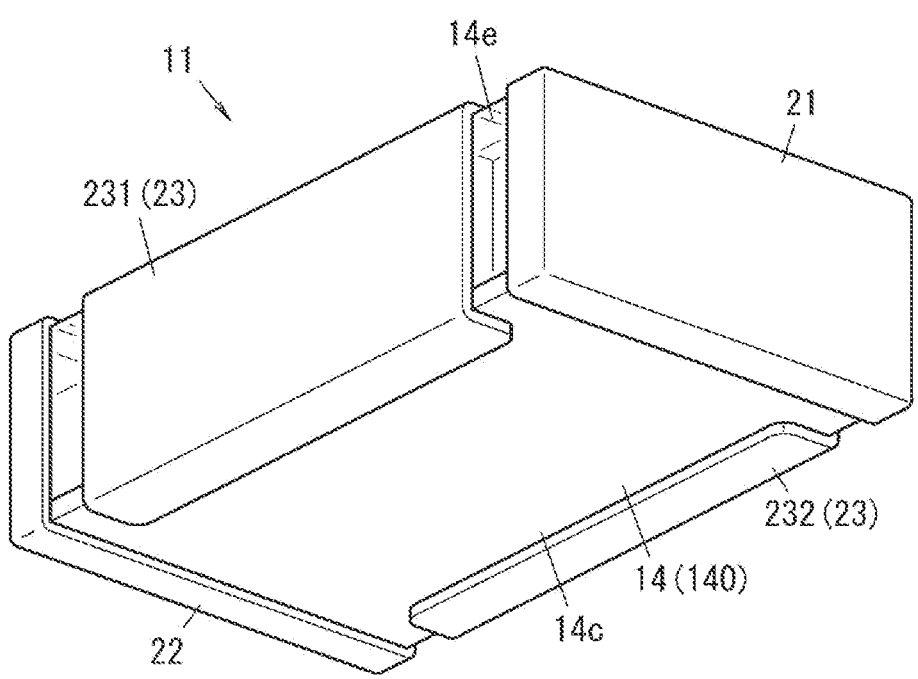
FIG. 10 is a perspective view of the electrolytic capacitor according to the second modification of the present disclosure.
Figure 11:
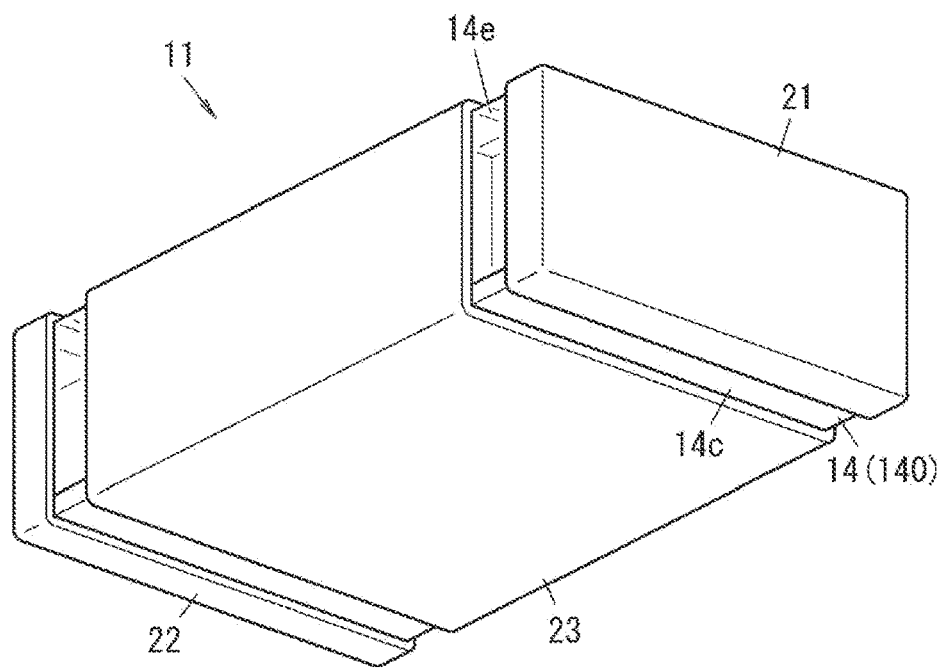
FIG. 11 is a perspective view of an electrolytic capacitor according to another aspect of the second modification of the present disclosure.

As another modification of this second modification, as illustrated in FIG. 11, two third external electrodes 23 in FIG. 10 may be connected on third surface 14c (bottom surface) to form one third external electrode 23.

(Third Modification)

A third modification related to the external electrodes will now be explained with reference to FIGS. 12 and 13. Configurations that are the same as those in the exemplary embodiment are given the same reference signs, and descriptions thereof will be omitted as appropriate.

Capacitor 11 according to this third modification is different from that of the exemplary embodiment in that first external electrode 21 and second external electrode 22 have different configurations. Each of first external electrode 21 and second external electrode 22 has a U-shape with its connected portion facing downwards. Each of first external electrode 21 and second external electrode 22 covers a part of third surface 14c (bottom surface) of exterior body 14, a part of fifth surface 14e (front surface), and a part of sixth surface 14f (rear surface). First external electrode 21 and second external electrode 22 also cover parts of fourth surface 14d (top surface).

The shape of third external electrodes 23 is similar to that of the exemplary embodiment. In other words, each third external electrode 23 has a U-shape with its connected portion facing downwards, and covers a part of third surface 14c (bottom surface), a part of fifth surface 14e (front surface), and a part of sixth surface 14f (rear surface). Each third external electrode 23 also cover a part of fourth surface 14d (top surface).

Figure 13:
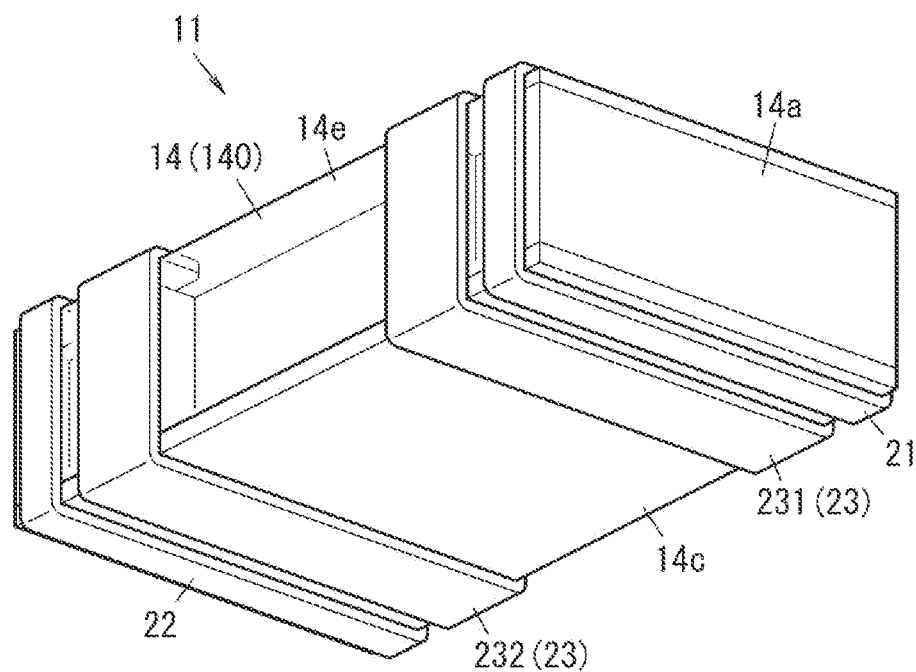
FIG. 13 is a perspective view of the electrolytic capacitor according to the third modification of the present disclosure.
Figure 14:
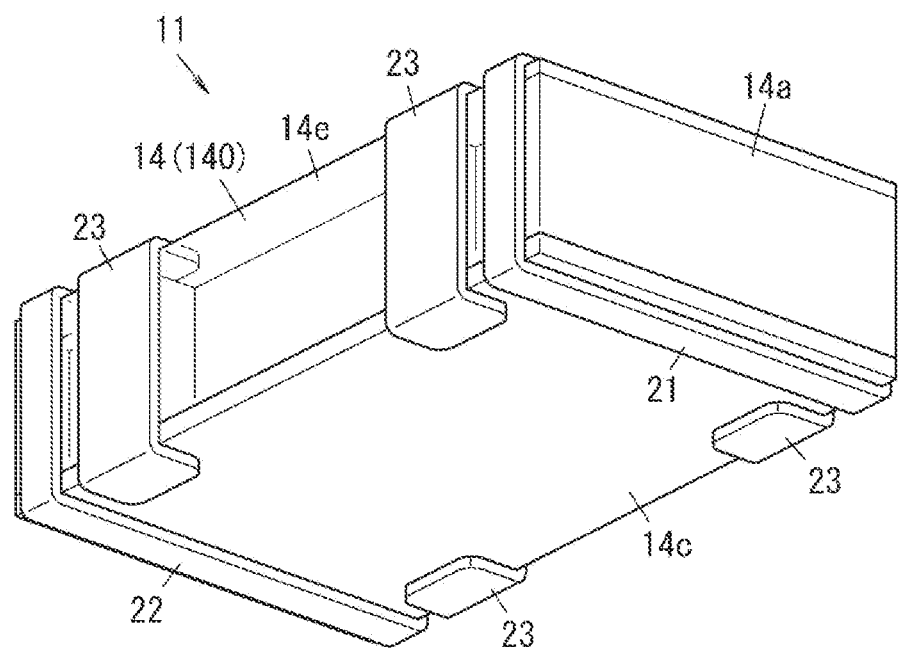
FIG. 14 is a perspective view of an electrolytic capacitor according to another aspect of the third modification of the present disclosure.

As a still further modification of this third modification, as illustrated in FIG. 14, four third external electrodes 23 may be provided instead of two third external electrodes 23 in FIG. 13. Since the configurations of four third external electrodes 23 are the same as those illustrated in FIG. 8, descriptions thereof will be omitted.

(Fourth Modification)

Figure 15:
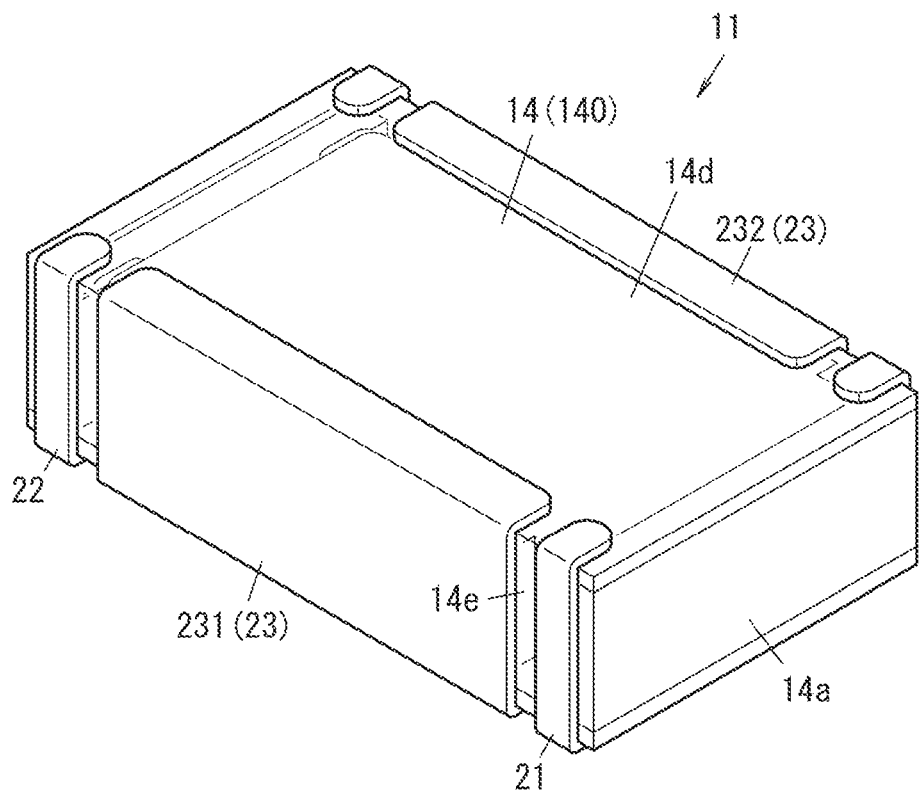
FIG. 15 is a perspective view of an electrolytic capacitor according to a fourth modification of the present disclosure.

A fourth modification related to the external electrodes will now be explained with reference to FIGS. 15 and 16. Configurations that are the same as those in the exemplary embodiment are given the same reference signs, and descriptions thereof will be omitted as appropriate.

Capacitor 11 according to this fourth modification is different from that of the exemplary embodiment in that first external electrode 21, second external electrode 22, and two third external electrodes 23 have different configurations.

Figure 12:
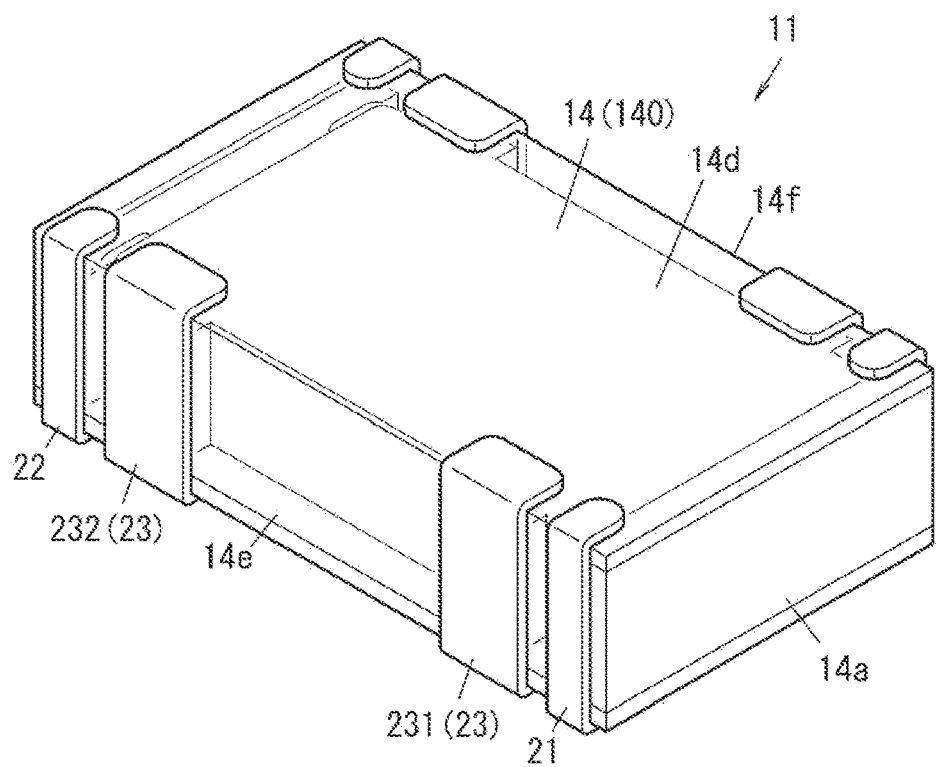
FIG. 12 is a perspective view of an electrolytic capacitor according to a third modification of the present disclosure.

Since the configurations of first external electrode 21 and second external electrode 22 are the same as those illustrated in FIG. 12, descriptions thereof will be omitted. Since the configurations of two third external electrodes 23 are the same as those illustrated in FIG. 10, descriptions thereof will be omitted.

Figure 16:
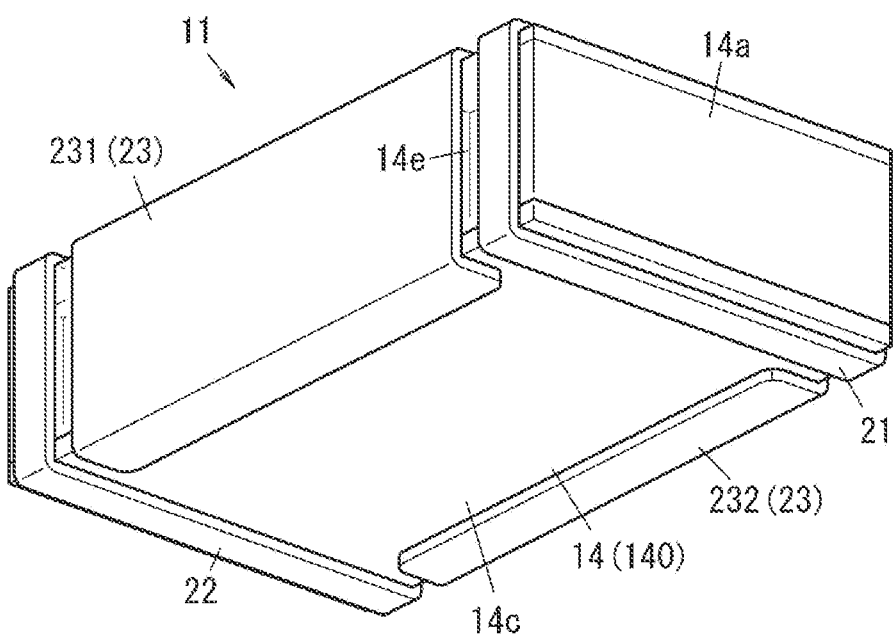
FIG. 16 is a perspective view of the electrolytic capacitor according to the fourth modification of the present disclosure.
Figure 17:
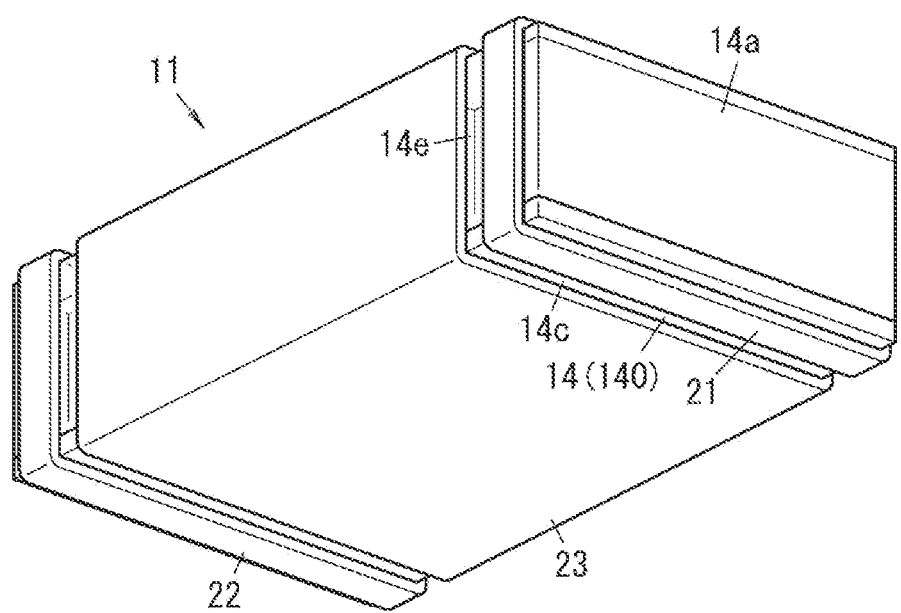
FIG. 17 is a perspective view of an electrolytic capacitor according to another aspect of the fourth modification of the present disclosure.

As still another modification of this fourth modification, as illustrated in FIG. 17, two third external electrodes 23 in FIG. 16 may be connected on third surface 14c (bottom surface) to form one third external electrode 23.

(Fifth Modification)

Figure 18:
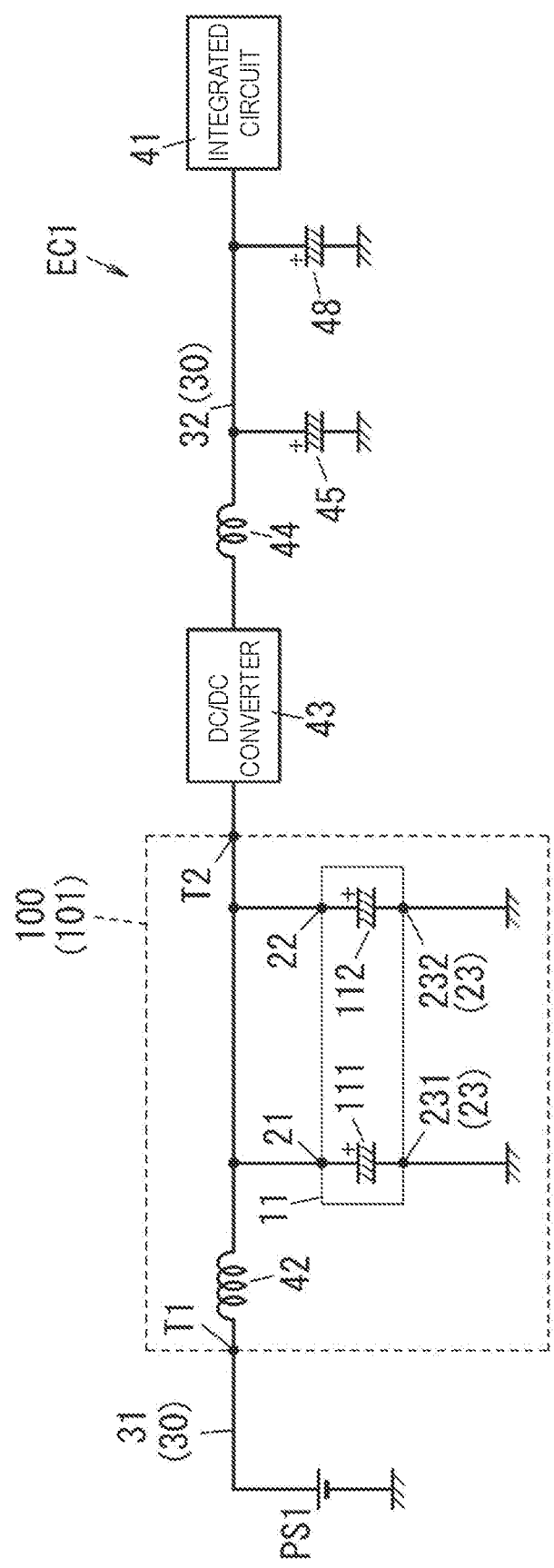
FIG. 18 is a circuit diagram of an electric circuit including a filter circuit according to a fifth modification of the present disclosure.

Fifth modification related to the circuit configuration of filter circuit 100 using capacitor 11 will now be explained with reference to FIG. 18.

Resonant circuit 101 forms an L-type filter. In other words, the first end of inductance element 42 is electrically connected to input end T1. First external electrode 21 of capacitor 11 is electrically connected to the second end of inductance element 42, and second external electrode 22 is also electrically connected to the second end of inductance element 42 as well. More specifically, first external electrode 21 and second external electrode 22 are electrically connected to connection points between the second end of inductance element 42 and output end T2.

In this manner, by using capacitor 11 having a relatively low ESL to provide the L-type filter, the amount by which signals attenuate can be increased across a relatively wide band.

Note that resonant circuit 101 may further include a second inductance element different from inductance element 42 (first inductance element). A first end of the second inductance element may be electrically connected to second external electrode 22, and a second end of the second inductance element may be electrically connected to output end T2. In other words, resonant circuit 101 may form a T-type filter.

(Other Modifications of Exemplary Embodiment)

Other modifications of the exemplary embodiment will be listed below. The following modifications may also be implemented in combinations, as appropriate. In addition, the following modifications may be implemented in a manner combined with the modifications described above, as appropriate.

In the exemplary embodiment, the number of capacitors 11 forming the alternating stacked structure and the end face collector structure is one. However, filter circuit 100 may include a plurality of capacitors 11. In addition, a parallel circuit of the plurality of capacitors 11 may electrically connects between the circuit 30 and conductor W3 that is at the reference potential.

As power source PS1, it is also possible to use an AC power source and an AC/DC converter that converts AC power input from the AC power source into DC power, and that outputs the DC power.

The number of sets of first capacitor element 10a and second capacitor element 10b is not limited to two, and may be one or three or more. In addition, first capacitor element 10a and second capacitor element 10b are not limited to those stacked alternately, and it is possible to include alternate stacking of a first stacked structure including a plurality of first capacitor elements 10a and a second stacked structure including a plurality of second capacitor elements 10b.

Exterior body 14 may include casing for housing sealing member 140.

SUMMARY

Based on the exemplary embodiment and the like described above, the following aspects are disclosed.

Filter circuit (100) according to first aspect includes resonant circuit (101). Resonant circuit (101) includes input end (T1), output end (T2), inductance element (42), and capacitor (11). Inductance element (42) electrically connects between input end (T1) and output end (T2). Capacitor (11) electrically connects between inductance element (42) and conductor (W3) that is at a reference potential. Capacitor (11) is an electrolytic capacitor. Capacitor (11) includes an element stacked body, exterior body (14), first external electrode (21) and second external electrode (22), and third external electrode (23). The element stacked body is formed as a stack of a plurality of capacitor elements (10). Exterior body (14) includes sealing member (140) covering the element stacked body. First external electrode (21) and second external electrode (22) are electrically connected to inductance element (42). Third external electrode (23) is electrically connected to conductor (W3) that is at the reference potential. Each of the plurality of capacitor elements (10) includes anode body (3), a dielectric layer, and cathode part (6). Anode body (3) includes a surface with porous part (5). The dielectric layer is disposed on a surface of at least a part of the porous part (5). Cathode part (6) covers at least a part of the dielectric layer. In first end portion (1a) of the ach of the plurality of capacitor elements (10), anode body (3) is exposed from exterior body (14). In second end portion (2a) of the ach of the plurality of capacitor elements (10), anode body (3) is covered by cathode part (6). The plurality of capacitor elements (10) include first capacitor element (10a) and second capacitor element (10b). In first capacitor element (10a), first end portion (1a) is electrically connected to first external electrode (21). In second capacitor element (10b), first end portion (1a) is electrically connected to second external electrode (22). Third external electrode (23) is electrically connected to cathode part (6) of capacitor element (10).

With the configuration described above, the ESL of capacitor (11) can be reduced. Therefore, because the ESL is reduced, the number of capacitors can be reduced, compared with a configuration including a plurality of capacitors having an ESL higher than that of the capacitors (11) are connected in parallel.

In filter circuit (100) according to a second aspect, in the first aspect, at least a part of first external electrode (21) is provided on first surface (14a) of exterior body (14). At least a part of second external electrode (22) is provided on second surface (14b) that is opposite to first surface (14a) of exterior body (14). At least a part of third external electrode (23) is provided on third surface (14c) that is different from first surface (14a) and second surface (14b) of exterior body (14).

With the configuration described above, the capacitance of capacitor (11) can be increased. Therefore, the number of capacitors can be reduced, compared with a configuration in which a plurality of capacitors each having a relatively small capacitance are connected in parallel to ensure the capacitance.

In filter circuit (100) according to a third aspect, in the second aspect, in viewing in the normal direction of third surface (14c), distance (L1) between first external electrode (21) and edge (2310) of third external electrode (23) facing first external electrode (21) is shorter than distance (L2) between line segment (S1) and edge (2310) of third external electrode (23). Line segment (S1) is orthogonal to a direction in which first surface (14a) and second surface (14b) are arranged, and divides the exterior body (14) into two halves.

With the configuration described above, because distance (L1) between third external electrode (23) and first external electrode (21) is relatively short, the ESL of capacitor (11) is improved.

In filter circuit (100) according to a fourth aspect, in any one of the first to third aspects, an input terminal of DC/DC converter (43) is electrically connected to output end (T2).

With the configuration described above, the noise of the input power of DC/DC converter (43) can be reduced.

In filter circuit (100) according to a fifth aspect, in any one of the first to the fourth aspects, first external electrode (21) is electrically connected to the first end of inductance element (42). Second external electrode (22) is electrically connected to the second end of inductance element (42).

With the configuration described above, since n type filter can be formed with one capacitor (11), the number of capacitors can be reduced, compared with a configuration in which two capacitors are used to form n type filter.

In filter circuit (100) according to a sixth aspect, in any one of the first to the fifth aspects, an equivalent series inductance of capacitor (11) is 100 [pH] or lower under a condition of a frequency ranging from 50 [MHz] to 1000 [MHz], inclusive.

With the configuration described above, the number of capacitors can be reduced.

In filter circuit (100) according to a seventh aspect, in any one of the first to sixth aspects, a capacitance of capacitor (11) is 10 [μF] or more.

With the configuration described above, the number of capacitors can be reduced.

The configurations other than the first aspect are not essential to filter circuit (100), and may be omitted as appropriate.

Further, a configuration according to the following eighth aspect may be implemented without requiring the configurations of the first aspect. Filter circuit (100) according to an eighth aspect includes resonant circuit (101). Resonant circuit (101) includes input end (T1), output end (T2), inductance element (42), and capacitor (11). Inductance element (42) electrically connects between input end (T1) and output end (T2). Capacitor (11) electrically connects between inductance element (42) and conductor (W3) that is at a reference potential. Capacitor (11) has an equivalent series inductance of 100 [pH] or lower, under a condition of a frequency of 50 [MHz] or higher and 1000 [MHz] or lower.

With the configuration described above, the number of capacitors can be reduced.

The invention claimed is:

1. A filter circuit comprising a resonant circuit, the resonant circuit including:
   an input end;
   an output end;
   an inductance element electrically connecting between the input end and the output end; and a capacitor electrically connecting between the inductance element and a conductor that is at a reference potential, wherein:
the capacitor is an electrolytic capacitor, and
the capacitor includes:
- an element stacked body that is a stack of a plurality of capacitor elements,
- an exterior body that includes a sealing member covering the element stacked body,
- a first external electrode and a second external electrode that are electrically connected to the inductance element, and
- a third external electrode electrically connected to the conductor that is at the reference potential, each of the plurality of capacitor elements includes:
- an anode body including a porous part on a surface of the anode body,
- a dielectric layer disposed on a surface of at least a part of the porous part, and
- a cathode part covering at least a part of the dielectric layer, in a first end portion of the each of the plurality of capacitor elements, the anode body is exposed from the exterior body, and
in a second end portion of the each of the plurality of capacitor elements, the anode body is covered by the cathode part,
the plurality of capacitor elements include a first capacitor element with the first end portion electrically connected to the first external electrode, and a second capacitor element with the first end portion electrically connected to the second external electrode, and
the third external electrode is electrically connected to the cathode part of the capacitor element.

2. The filter circuit according to claim 1, wherein:
at least a part of the first external electrode is provided on a first surface of the exterior body,
at least a part of the second external electrode is provided on a second surface of the exterior body, the second surface being opposite to the first surface, and
at least a part of the third external electrode is provided on a third surface of the exterior body, the third surface being different from the first surface and the second surface.

3. The filter circuit according to claim 2, wherein, in viewing in a normal direction of the third surface, a distance between the first external electrode and an edge of the third external electrode, the edge being an edge facing the first external electrode, is shorter than a distance between a line segment and the edge of the third external electrode, the line segment being orthogonal to a direction in which the first surface and the second surface are arranged and dividing the exterior body into two halves.

4. The filter circuit according to claim 1, wherein an input terminal of a DC/DC converter is electrically connected to the output end.

5. The filter circuit according to claim 1, wherein:
the first external electrode is electrically connected to a first end of the inductance element, and
the second external electrode is electrically connected to a second end of the inductance element.

6. The filter circuit according to claim 1, wherein an equivalent series inductance of the capacitor is 100 pH or lower, under a condition of a frequency ranging from 50 MHz to 1000 MHz, inclusive.

7. The filter circuit according to claim 1, wherein a capacitance of the capacitor is 10 μF or more.

* * * * *